(12) United States Patent
Whetsel

(10) Patent No.: US 9,081,059 B2
(45) Date of Patent: *Jul. 14, 2015

(54) FORMATTER SELECTIVELY ROUTING RESPONSE DATA TO STIMULUS DATA INPUTS

(71) Applicant: Texas Instruments Incorporated, Dallas, TX (US)

(72) Inventor: Lee D. Whetsel, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 64 days.

This patent is subject to a terminal disclaimer.

(21) Appl. No.: 13/890,781

(22) Filed: May 9, 2013

(65) Prior Publication Data

US 2013/0290801 A1  Oct. 31, 2013

Related U.S. Application Data

(62) Division of application No. 13/568,533, filed on Aug. 7, 2012, now Pat. No. 8,464,116, which is a division of application No. 13/325,740, filed on Dec. 14, 2011, now Pat. No. 8,271,840, which is a division of application No. 12/607,436, filed on Oct. 28, 2009, now Pat. No. 8,099,642.

(60) Provisional application No. 61/110,804, filed on Nov. 3, 2008.

(51) Int. Cl.
*G01R 31/3177* (2006.01)
*G01R 31/3185* (2006.01)

(52) U.S. Cl.
CPC .... *G01R 31/3177* (2013.01); *G01R 31/318536* (2013.01); *G01R 31/318544* (2013.01)

(58) Field of Classification Search
CPC ............... G01R 31/318536; G01R 31/318544; G01R 31/3177
USPC .................... 714/726, 727, 729, 732
See application file for complete search history.

(56) References Cited

U.S. PATENT DOCUMENTS

| | | | |
|---|---|---|---|
| 6,260,165 B1 * | 7/2001 | Whetsel | 714/727 |
| 6,807,645 B2 * | 10/2004 | Angelotti et al. | 714/732 |
| 7,237,162 B1 * | 6/2007 | Wohl et al. | 714/726 |
| 7,702,983 B2 * | 4/2010 | Casarsa | 714/729 |

(Continued)

OTHER PUBLICATIONS

Wohl, P.; Waicukauski, J.A.; Neuveux, F.;, "Increasing Scan Compression by Using X-chains," Test Conference, 2008. ITC 2008. IEEE International, vol., No., pp. 1-10, Oct. 28-30, 2008.*

(Continued)

*Primary Examiner* — Cynthia Britt

(74) *Attorney, Agent, or Firm* — Lawrence J. Bassuk; Charles A. Brill; Frank D. Cimino

(57) ABSTRACT

The disclosure describes a novel method and apparatus for allowing response data output from the scan outputs of a circuit under test to be formatted and applied as stimulus data input to the scan inputs of the circuit under test. Also the disclosure described a novel method and apparatus for allowing the response data output from the scan outputs of a circuit under test to be formatted and used as expected data to compare against the response data output from the circuit under test. Additional embodiments are also provided and described in the disclosure.

4 Claims, 32 Drawing Sheets

(56) References Cited

U.S. PATENT DOCUMENTS

| | | | |
|---|---|---|---|
| 7,716,545 B2 * | 5/2010 | Shimooka | 714/726 |
| 8,099,642 B2 * | 1/2012 | Whetsel | 714/729 |
| 2004/0246337 A1 * | 12/2004 | Hasegawa et al. | 348/189 |
| 2007/0168814 A1 * | 7/2007 | Leininger et al. | 714/738 |
| 2007/0234163 A1 * | 10/2007 | Mukherjee et al. | 714/736 |

OTHER PUBLICATIONS

Bhattacharya, B.B.; Dmitriev, A.; Gossel, M.; Chakrabarty, K.; "Synthesis of single-output space compactors for scan-based sequential circuits," Computer-Aided Design of Integrated Circuits and Systems, IEEE Transactions on, vol. 21, No. 10, pp. 1171-1179, Oct. 2002.*

* cited by examiner

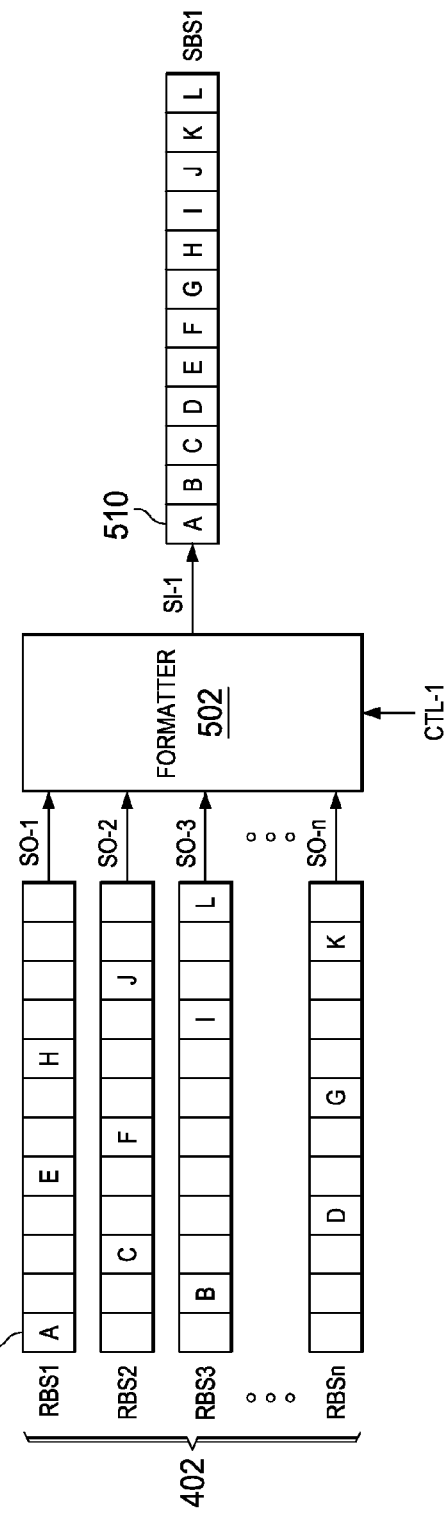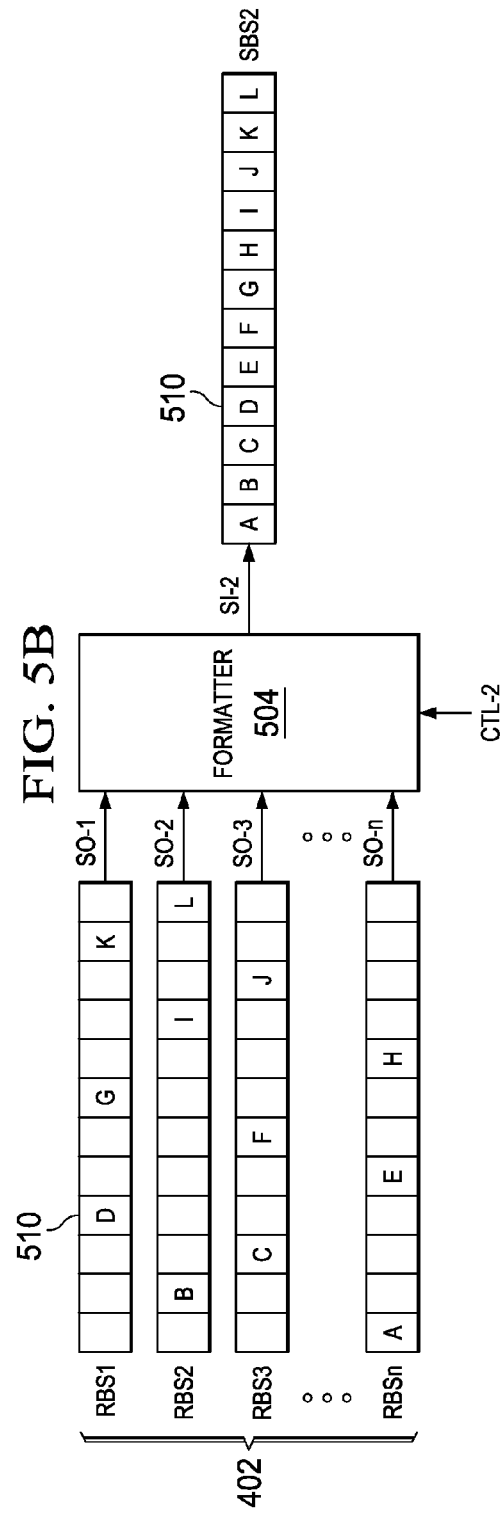

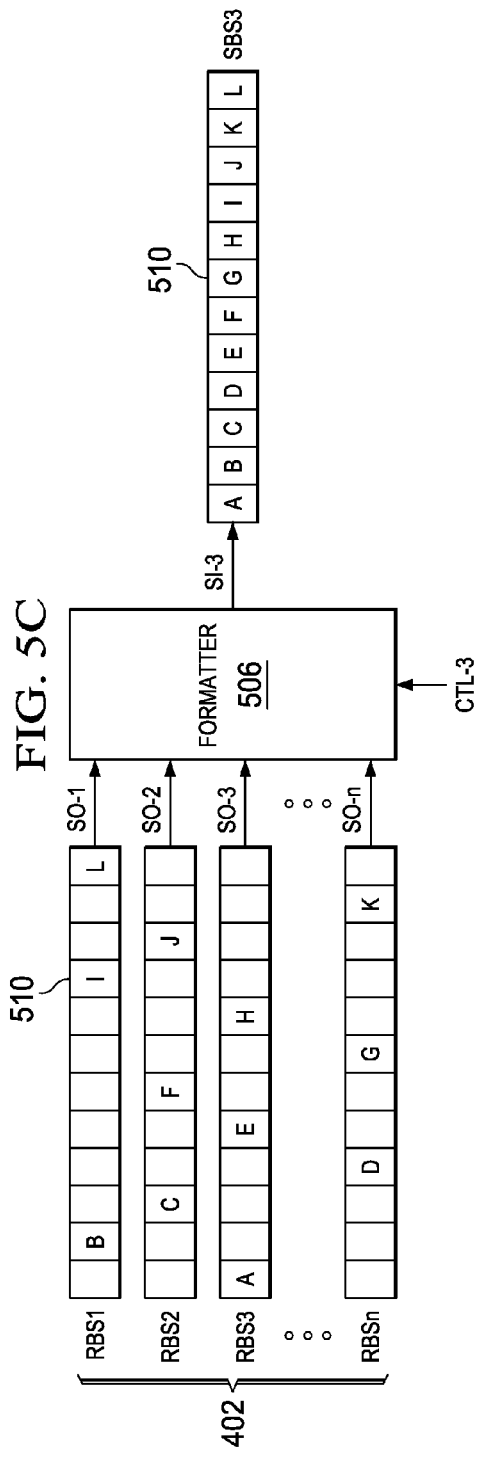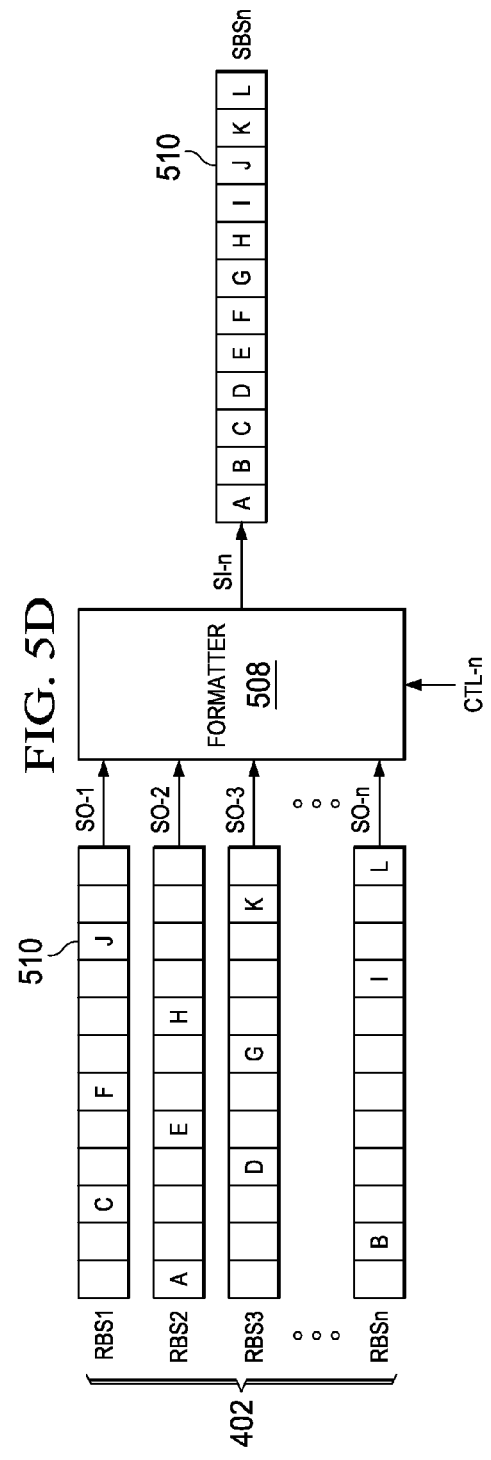

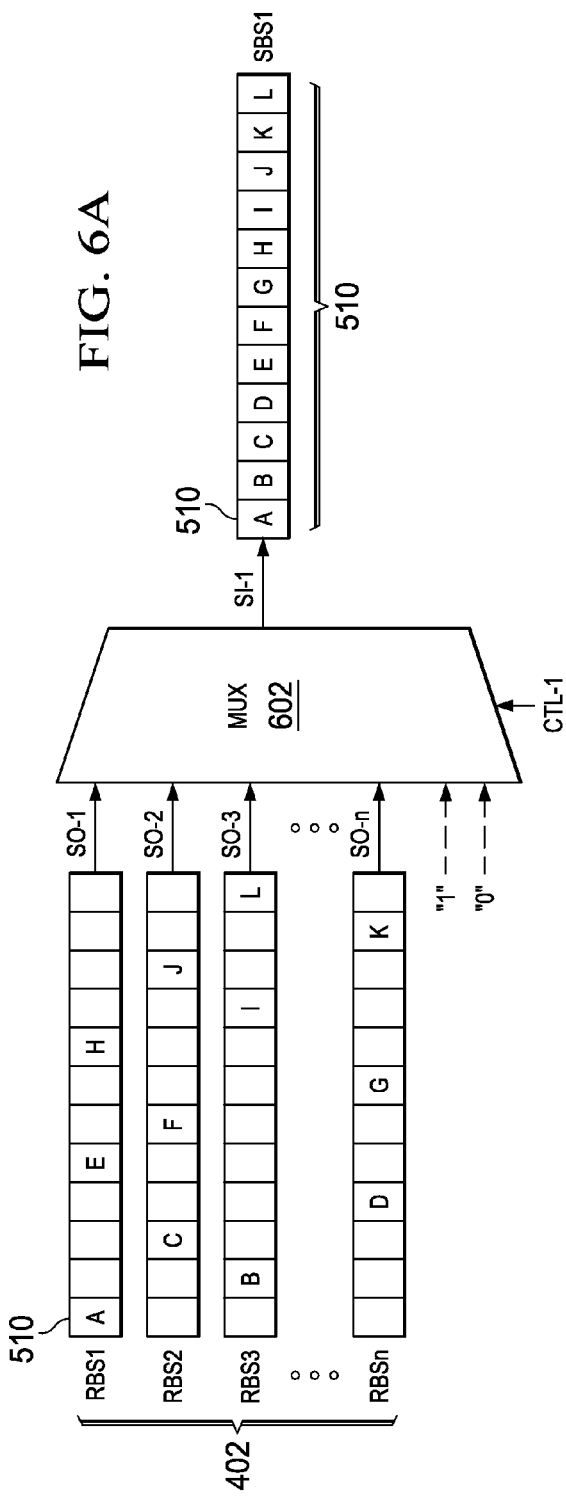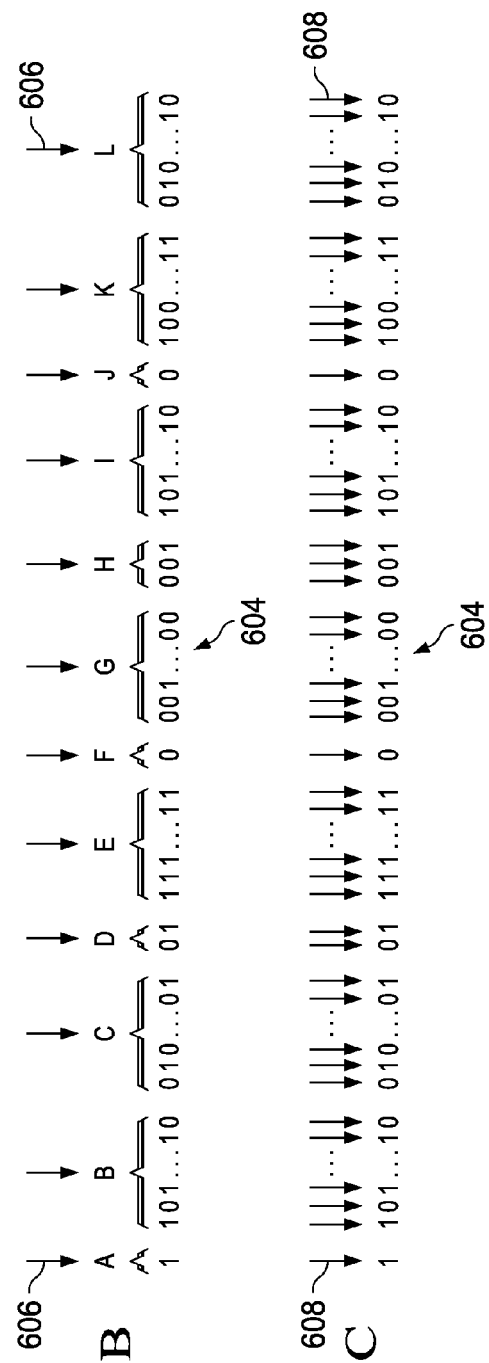

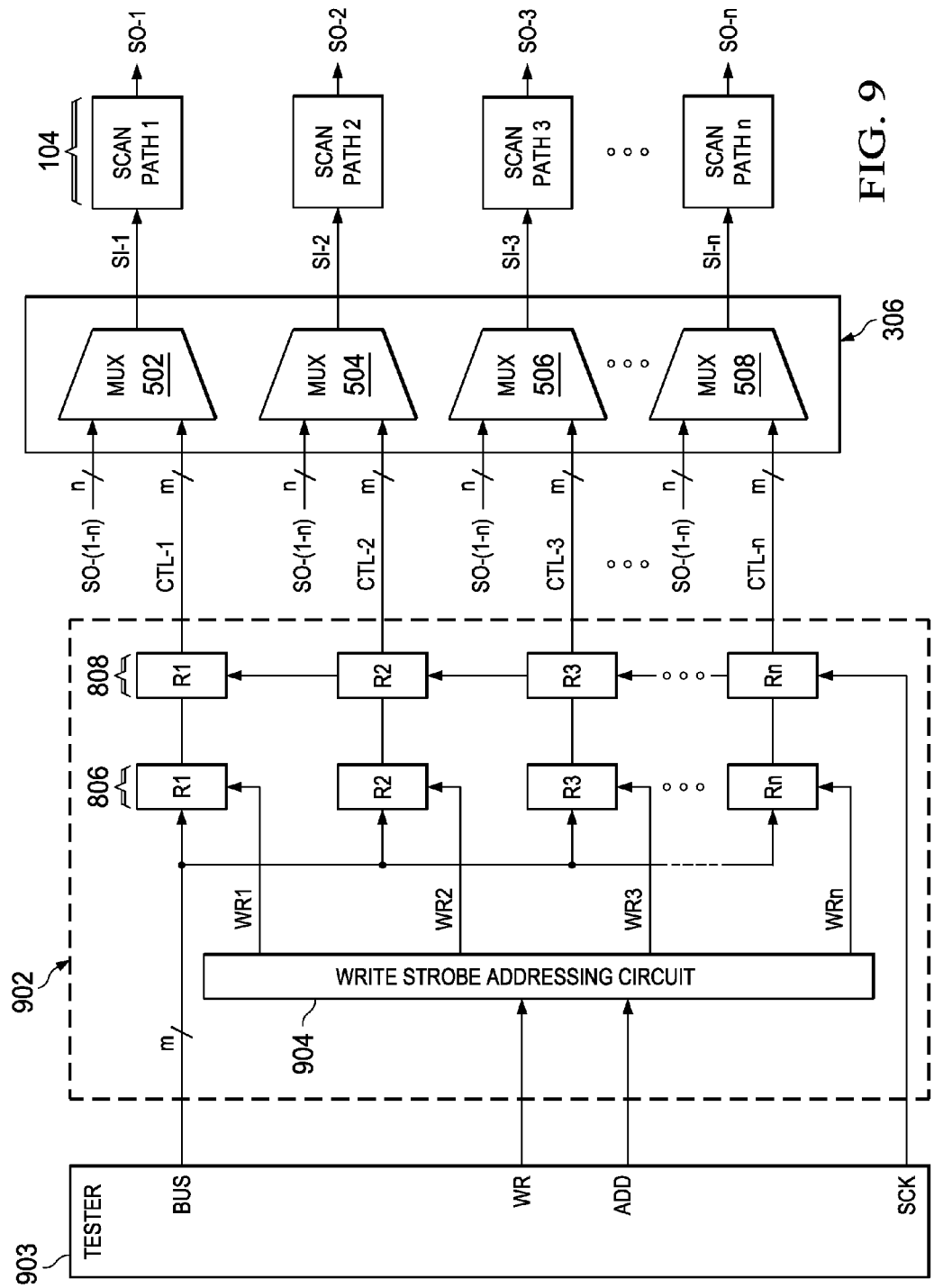

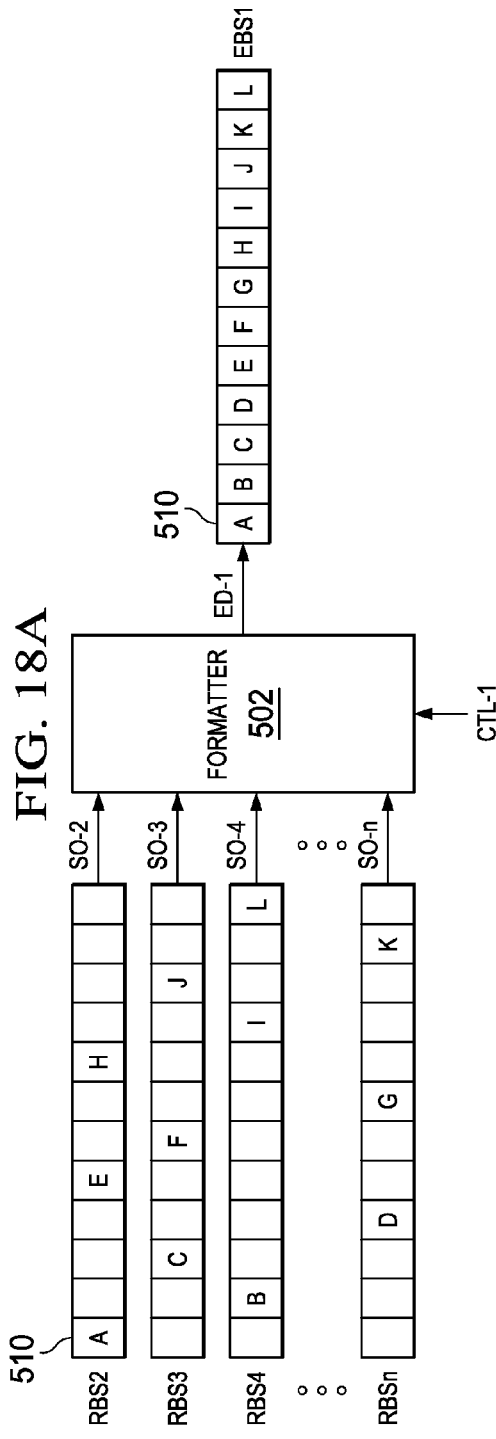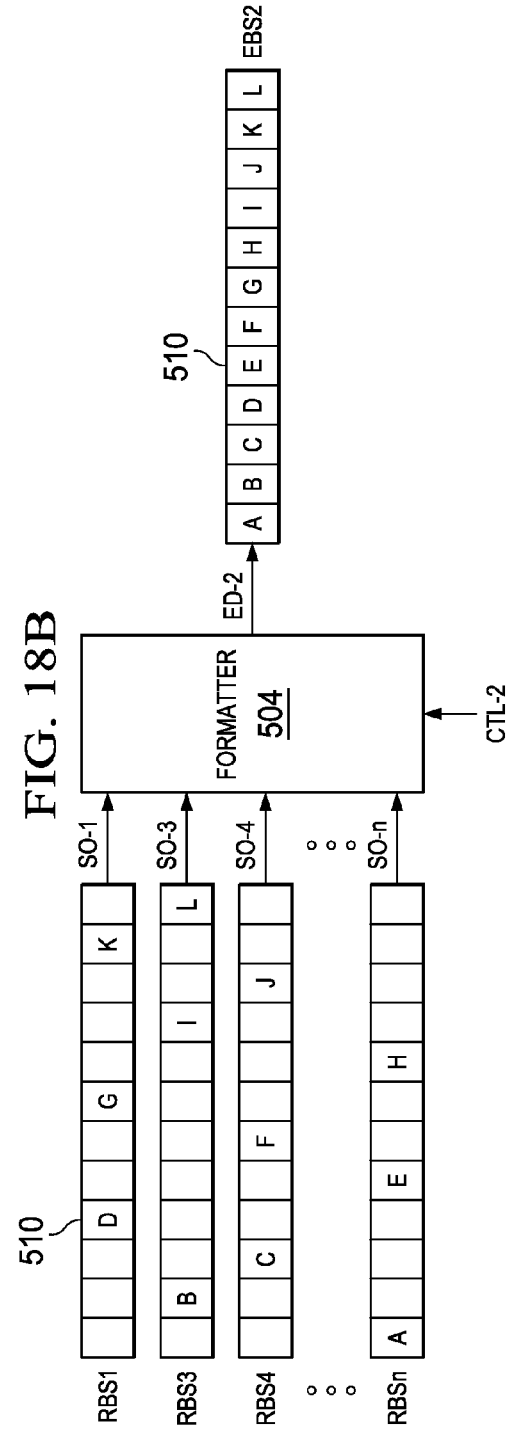

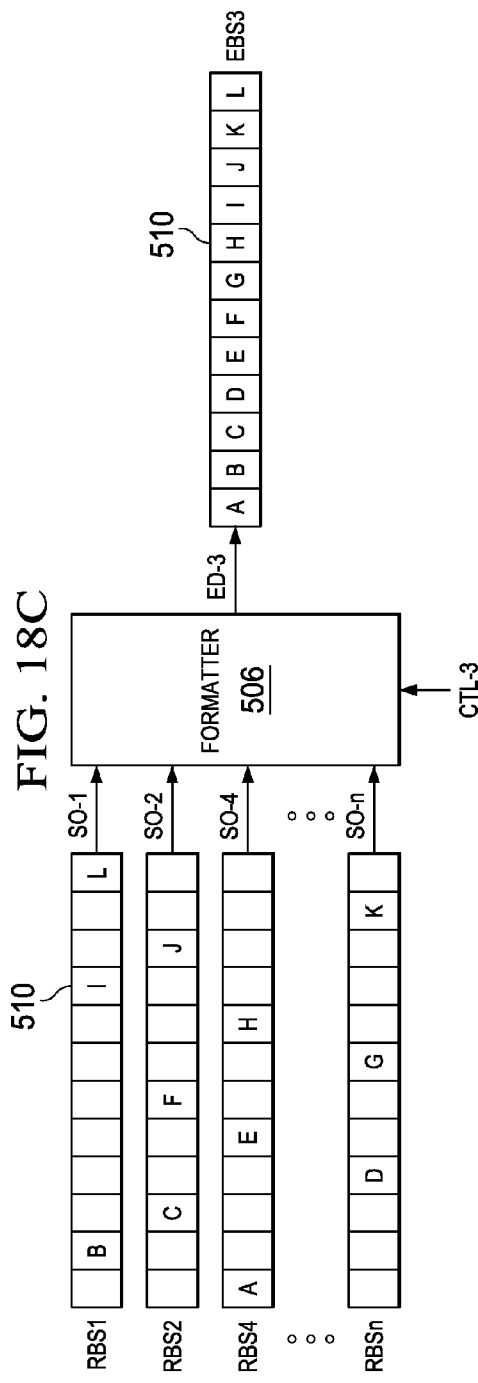
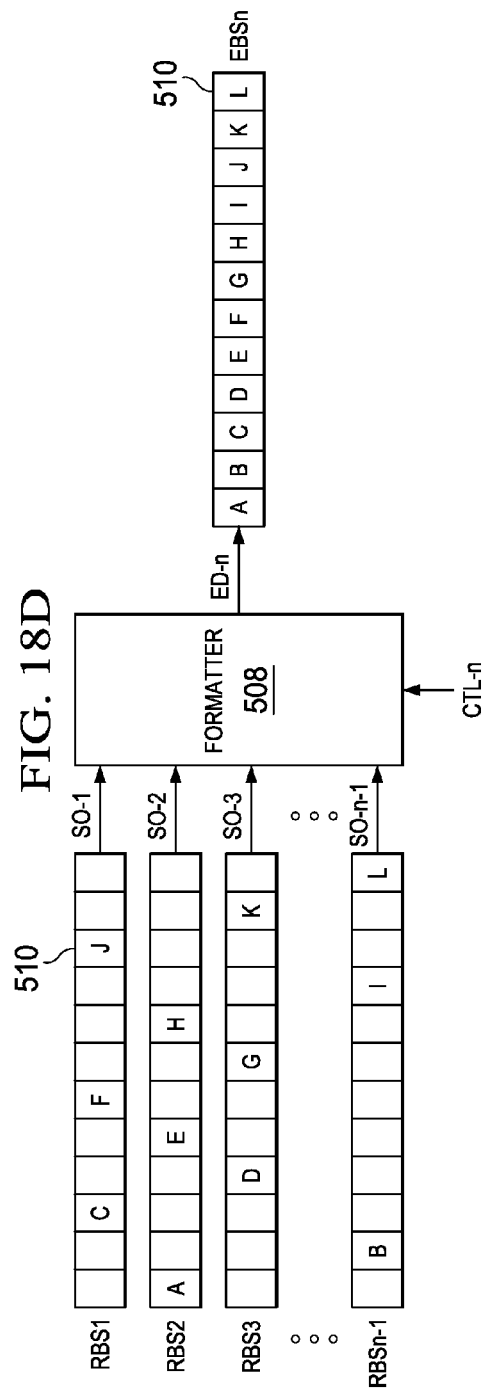

FORMATTER SELECTIVELY ROUTING RESPONSE DATA TO STIMULUS DATA INPUTS

CROSS REFERENCE TO RELATED PATENTS

This application is a divisional of application Ser. No. 13/568,533, filed Aug. 7, 2012, now U.S. Pat. No. 8,464,116, issued Jun. 11, 2013;

Which was a divisional of application Ser. No. 13/325,740, filed Dec. 14, 2011, now U.S. Pat. No. 8,271,840, granted Sep. 18, 2012;

Which was a divisional of application Ser. No. 12/607,436, filed Oct. 28, 2009, now U.S. Pat. No. 8,099,642, granted Jan. 17, 2012;

Which claims priority from Provisional Application No. 61/110,804, filed Nov. 3, 2008.

This application is related to application Ser. No. 08/931,791, filed Sep. 16, 1997, now U.S. Pat. No. 6,260,165, granted Jul. 10, 2001.

FIELD OF THE DISCLOSURE

This disclosure relates generally to device scan testing and in particular to device scan testing whereby the scan response outputs from a device under test are used for testing the device under test.

BACKGROUND OF THE DISCLOSURE

Most electrical circuits today, which may be IC devices or embedded sub-circuits within IC devices, are tested using parallel scan path approaches whereby the parallel scan paths are used to input and apply test stimulus patterns to a circuit's combinational logic and to capture and output test response patterns from the circuit's combinational logic.

FIG. 1 illustrates a conventional example of a circuit's 100 combinational logic 102 being tested via parallel scan paths 1-n 104. As previously mentioned, circuit 100 could be an IC or an embedded sub-circuit within an IC. Each scan path 1-n has a scan input (SI-1-n) 106 and a scan output (SO-1-n). Each scan path 1-n is also coupled to a scan enable (SEN) input 110 and to a scan clock (SCK) input 112. The SEN and SCK inputs cause the scan paths 1-n to; (1) input stimulus bit streams 122 during each stimulus input shift cycle 114 to be applied as stimulus 116 to the combinational logic, (2) capture the resulting response 118 from the combinational logic, and (3) shift the captured response data out as response bit streams 124 during each response output shift cycle 120. The structure and operations of the parallel scan paths of FIG. 1 are well known.

FIG. 2 illustrates a typical arrangement between a scan tester 200 and a circuit 100 within an IC 200 that is to be scan tested. Typical scan testers comprise a stimulus data memory 204 for storing stimulus patterns 114 to be input to circuit 100 via SI-1-n, an expected data memory 206 for storing the expected data (ED-1-n) patterns from circuit 100, a compare pass/fail circuit 208 for comparing the expected data from expected data memory 206 against the response patterns 120 output from circuit 100 via SO-1-n, and a controller circuit 210 to control the operation of the stimulus data memory, response data memory, compare pass/fail circuit, and the SCK and SEN inputs to circuit 100 via bus 212.

During test, the controller circuit 210 operates the SCK and SEN inputs to circuit 100 to shift in stimulus bit streams 122 during each shift cycle 114 via SI-1-n, capture response data 118 from combinational logic 102 of circuit 100, and shift out response bit streams 124 during each shift cycle 120 via SO-1-n. Each bit in the response bit stream 124 is compared to an expected data bit from the expected data memory 206. The compare pass/fail circuit is controlled by the SCK and SEN signals to allow it to operate in synchronicity with circuit 100 to allow it to know when to compare the response bits against the expected data bits. The compare pass/fail circuit 208 may be simple or complex. A simple compare pass/fail circuit 208 may simply detect and log the first mismatch between the response bits output from circuit 100 and the expected data bits output from the expected data memory 206. However, a complex compare pass/fail circuit 208 may detect and log all mismatches between the response bit outputs from circuit 100 and the expected data bits output from the expected data memory 206. Further, the more complex compare pass/fail circuit 208 may include the ability to mask off certain compare operations between response bits and expected data bits during the test. At the end of test, the controller circuit 210 accesses the compare pass/fail circuit, via bus 212, to obtain pass/fail information.

The stimulus data memory 204 and expected data memory 206 of tester 200 may need to be very large. For example, circuit 100 may contain 32 scan paths 104 each being 50,000 bits long. In this example, the stimulus data memory 204 needs to store 50,0000 32-bit wide stimulus bit patterns to be input to circuit 100 during each shift cycle 114 operation, and the expected data memory 206 needs to store 50,0000 32-bit wide expected data bit patterns to match against the response bit patterns output from circuit 100 during each shift cycle operation. Assuming 10,000 shift cycle operations are required for the test, the memories 204 and 206 would each need to be able to store 500 million 32-bit patterns. Additionally, memories 204 and 206 would need to be fast memories to allow operating the shift operations at high SCK rates to reduce the shift cycle times during test. The need for large high speed stimulus and expected data memories increases the cost of scan testers 200, which is reflected in the selling cost of the IC to the customer.

BRIEF SUMMARY OF THE DISCLOSURE

This disclosure describes a method and apparatus for allowing the response data patterns from parallel scan paths of a circuit to be used to provide stimulus data patterns for input to the parallel scan paths of the circuit. Additionally, the response data patterns can provide expected data patterns for comparing against the response data patterns.

BRIEF DESCRIPTION OF THE VIEWS OF THE DRAWINGS

FIGS. 5A, 5B, 5C, and 5D illustrate individual sections of the formatter circuit of FIG. 4 according to the disclosure.

FIG. 6A illustrates using a multiplexer to realize a formatter section of FIG. 5 according to the disclosure.

FIG. 6B illustrates the timing of inputting control to the multiplexer of FIG. 6A to produce stimulus data from response data according to the disclosure.

FIG. 6C illustrates the conventional timing of inputting stimulus data to a circuit from a tester.

FIG. 9 illustrates the formatter of FIG. 7 being controlled by an addressable write strobe circuit according to the disclosure.

FIGS. 18A, 18B, 18C, and 18D illustrate individual sections of the formatter circuit of FIG. 17 according to the disclosure.

DETAILED DESCRIPTION OF THE DISCLOSURE

Figure 1:
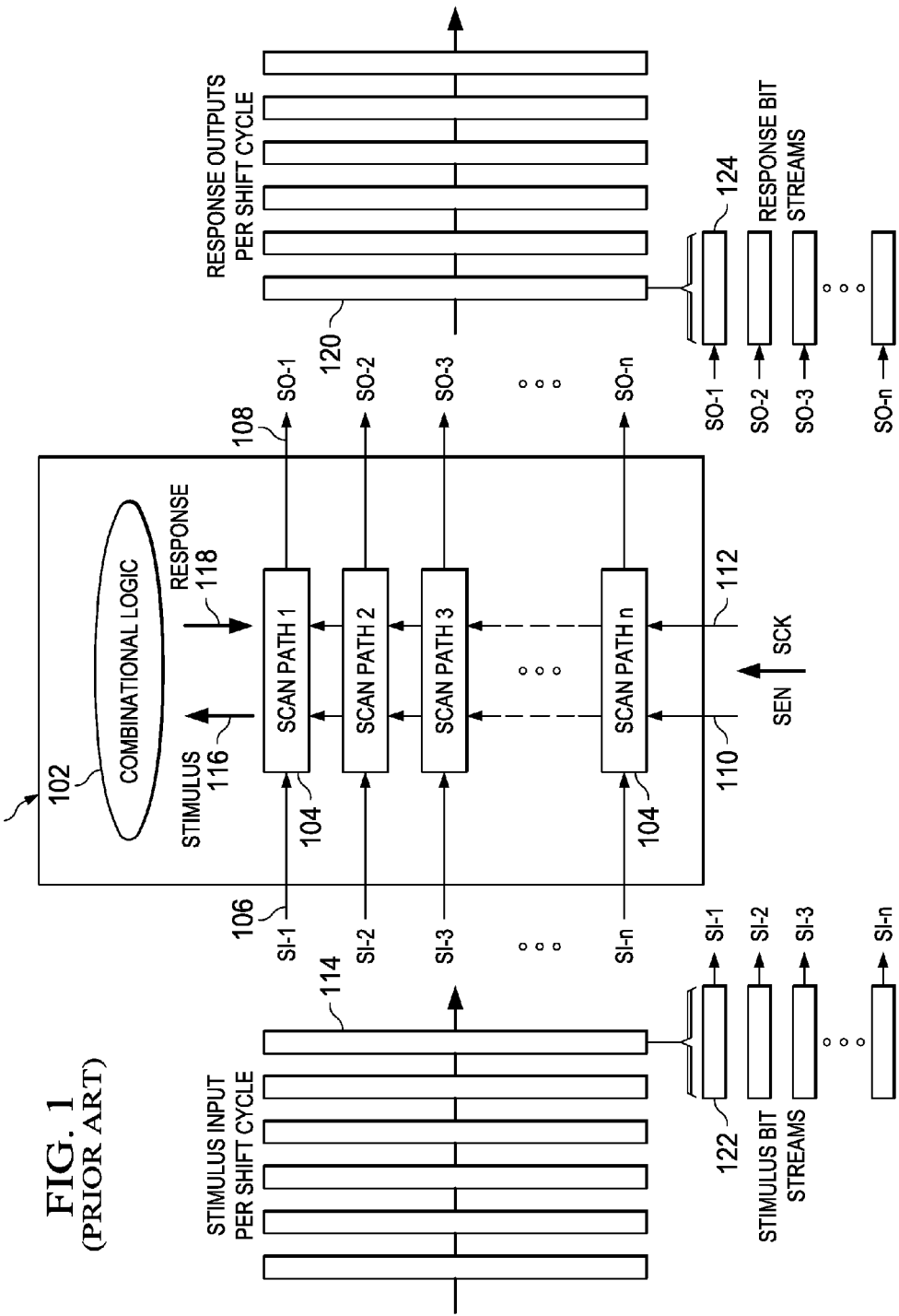
FIG. 1 illustrates a conventional scan test architecture within a circuit.
Figure 2:
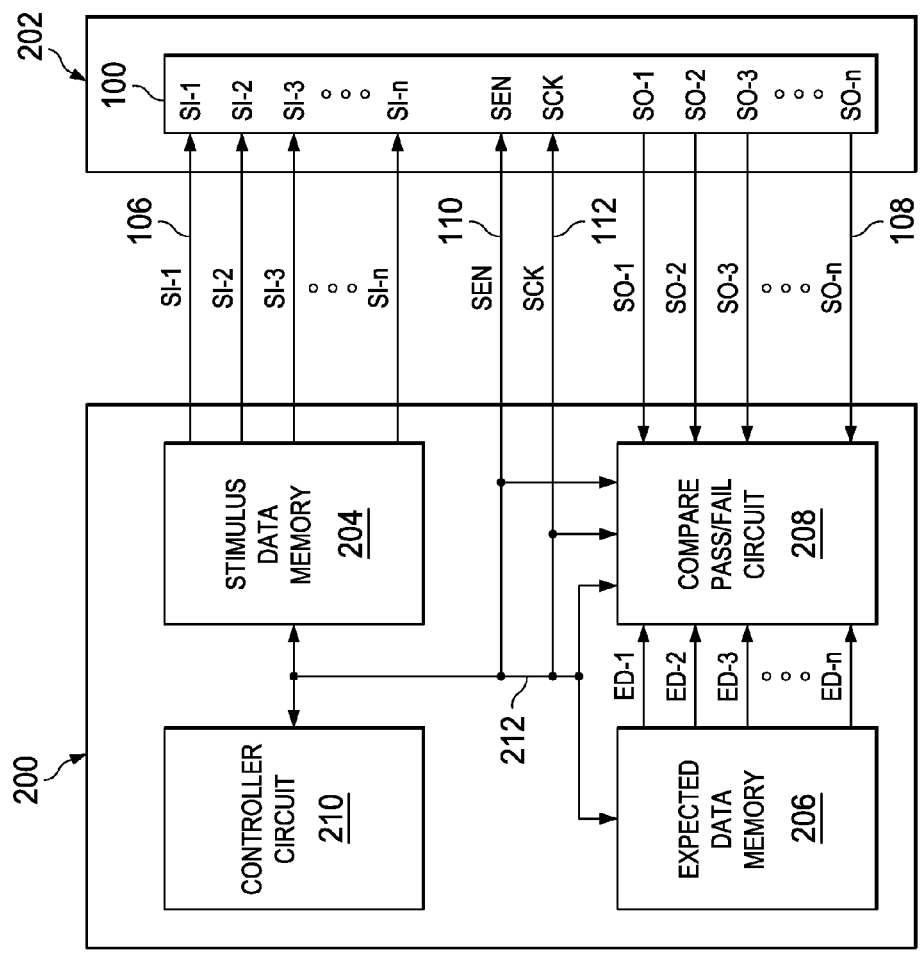
FIG. 2 illustrates a conventional scan test arrangement between a circuit under test and a tester.
Figure 3:
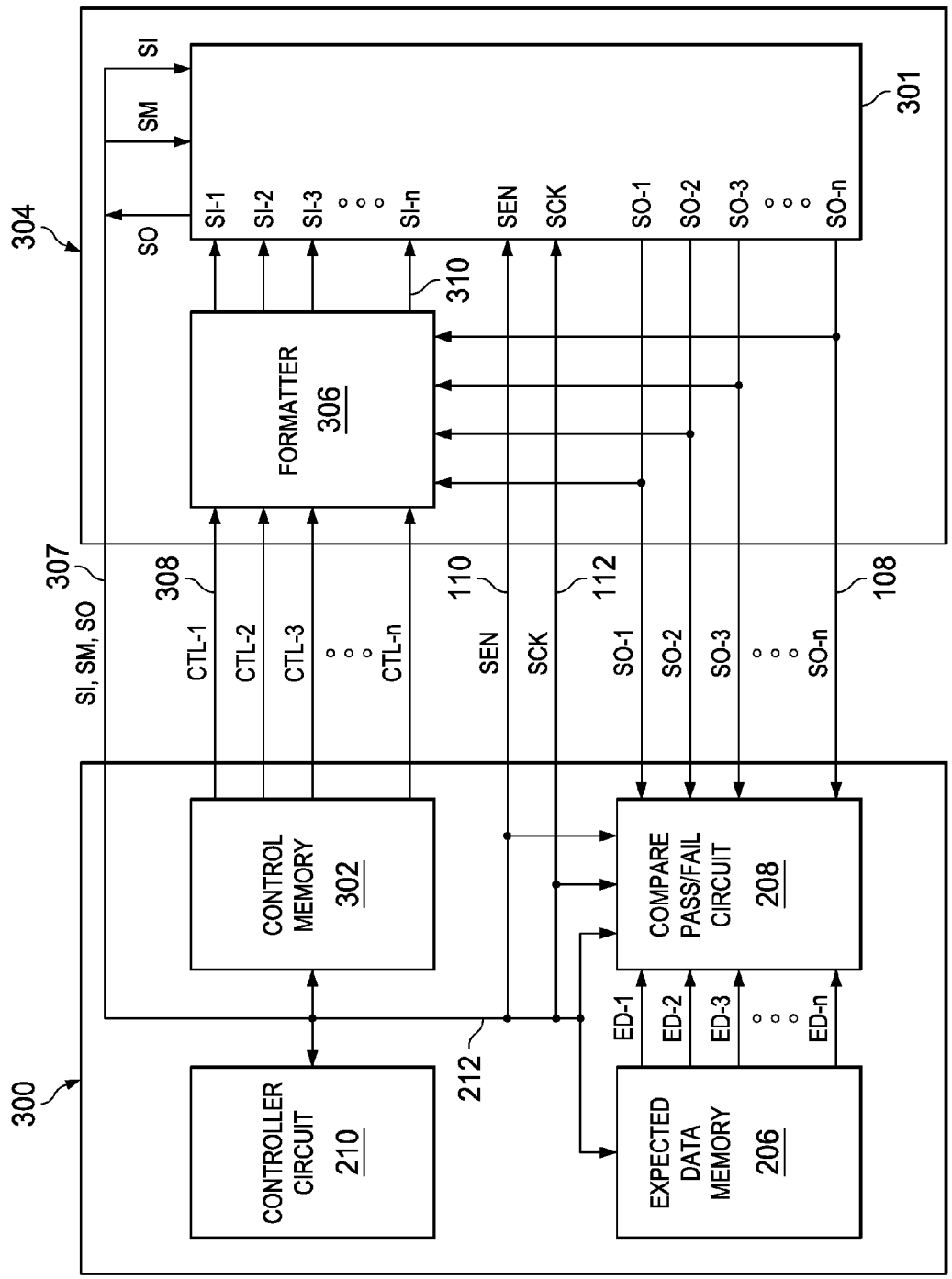
FIG. 3 illustrates a scan test arrangement between a circuit under test and a tester according to the disclosure.

FIG. 3 illustrates an IC 304 containing a first embodiment of the disclosure coupled to a scan tester 300. The IC comprises an embedded circuit 301 to be scan tested and a formatter circuit 306. Circuit 301 is similar to circuit 100 of FIGS. 1 and 2 in that it has scan inputs (SI-1-$n$) 310, scan outputs (SO-1-$n$) 108, a SEN control input 110 and a SCK 112 control input. Circuit 301 differs from circuit 100 in that it includes a serial interface bus 307 consisting of a serial input (SI), serial mode input (SM), and a serial output (SO). The serial interface bus 307 of circuit 301 is controlled by bus 212 of tester 300. Circuit 301 receives SCK and SEN control inputs from the tester via bus 212 and outputs response data to the tester via SO-1-$n$ 108 as previously described in regard to FIG. 2.

The formatter circuit 306, according to the disclosure, is used to provide the stimulus data patterns to circuit 301 via the SI-1-$n$ inputs 310. The formatter 306 inputs response data patterns from the SO-1-$n$ outputs 108 of circuit 301, inputs stimulus data control signals 308 (CTL-(1-$n$)) from tester 300, and outputs stimulus data patterns to the SI-1-$n$ inputs 310 of circuit 301. The tester 300 is the similar to tester 200 of FIG. 2 with the exception that it uses a control memory 302 instead of a stimulus data memory 204 and it provides the serial interface bus 307 to circuit 301.

Figure 3A:
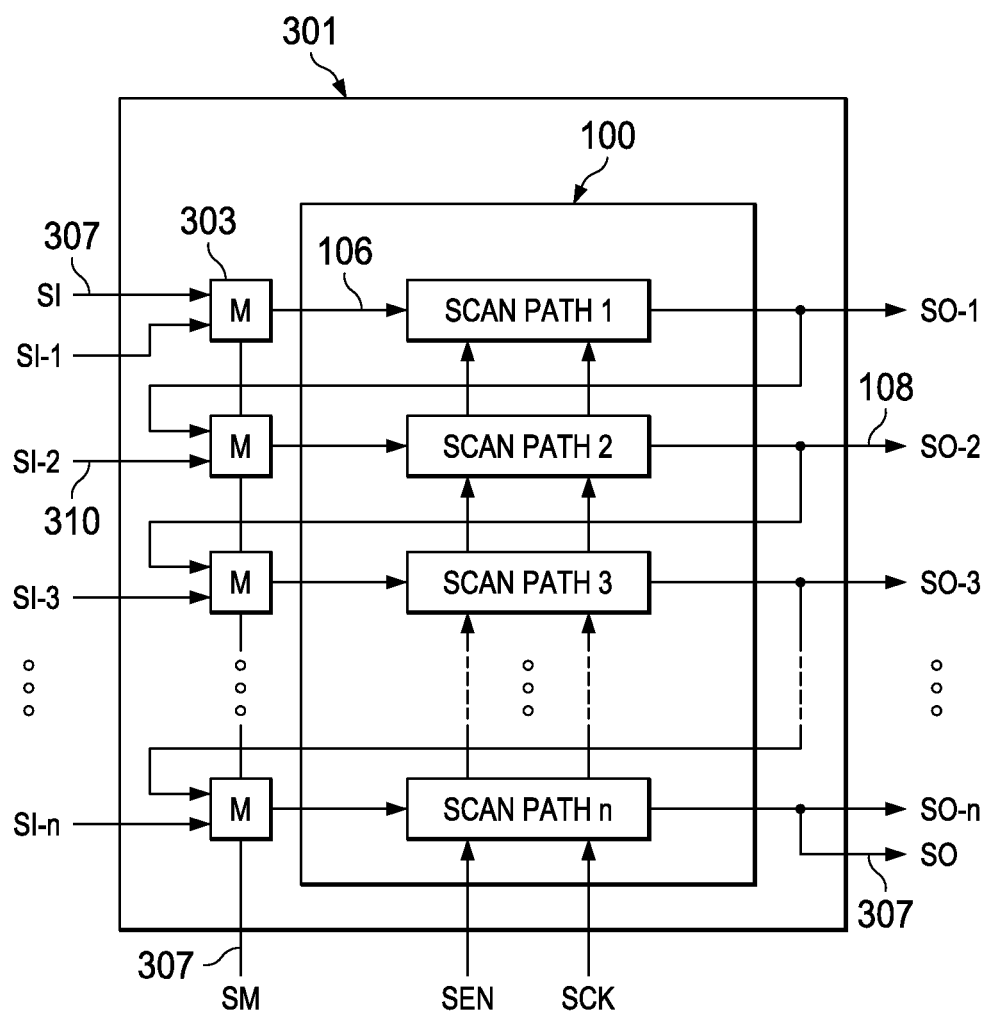
FIG. 3A illustrates the circuit under test of FIG. 3 in more detail according to the disclosure.

FIG. 3A illustrates the circuit 301 in more detail. As seen, circuit 301 contains a circuit 100 to be scan tested and multiplexers 303 for allowing the scan inputs 106 of the circuit 100 scan paths 104 to come from either the formatter 306 or from the serial input (SI) of serial interface bus 307. When the serial mode (SM) signal of interface 307 is set to a first logic level, the scan paths 104 are all placed in series, via the multiplexers 303, to allow the scan paths 104 to be scanned via the serial input (SI) and serial output (SO) of interface 307. While in serial mode, the SCK and SEN control signals operate the scan paths 104 to shift data and to capture data as previously described. The serial interface bus 307 is used at the beginning of a test to load a desired initial pattern into all the scan paths 104 of circuit 100. After the scan paths have been initialized, the serial mode (SM) signal is set to a second logic level which causes the multiplexers 303 to couple the scan inputs (SI-1-$n$) 106 of the scan paths to the outputs of formatter 306, via scan inputs (SI-1-$n$) 310, to prepare for testing using formatter 306. While the serial interface 307 is described as a method of initializing the scan paths 104 prior to testing using the formatter 306, the serial interface 307 can also be used as an alternate method of testing circuit 100 when the scan paths are placed in the serial mode arrangement between SI and SO of bus 307.

Figure 4:
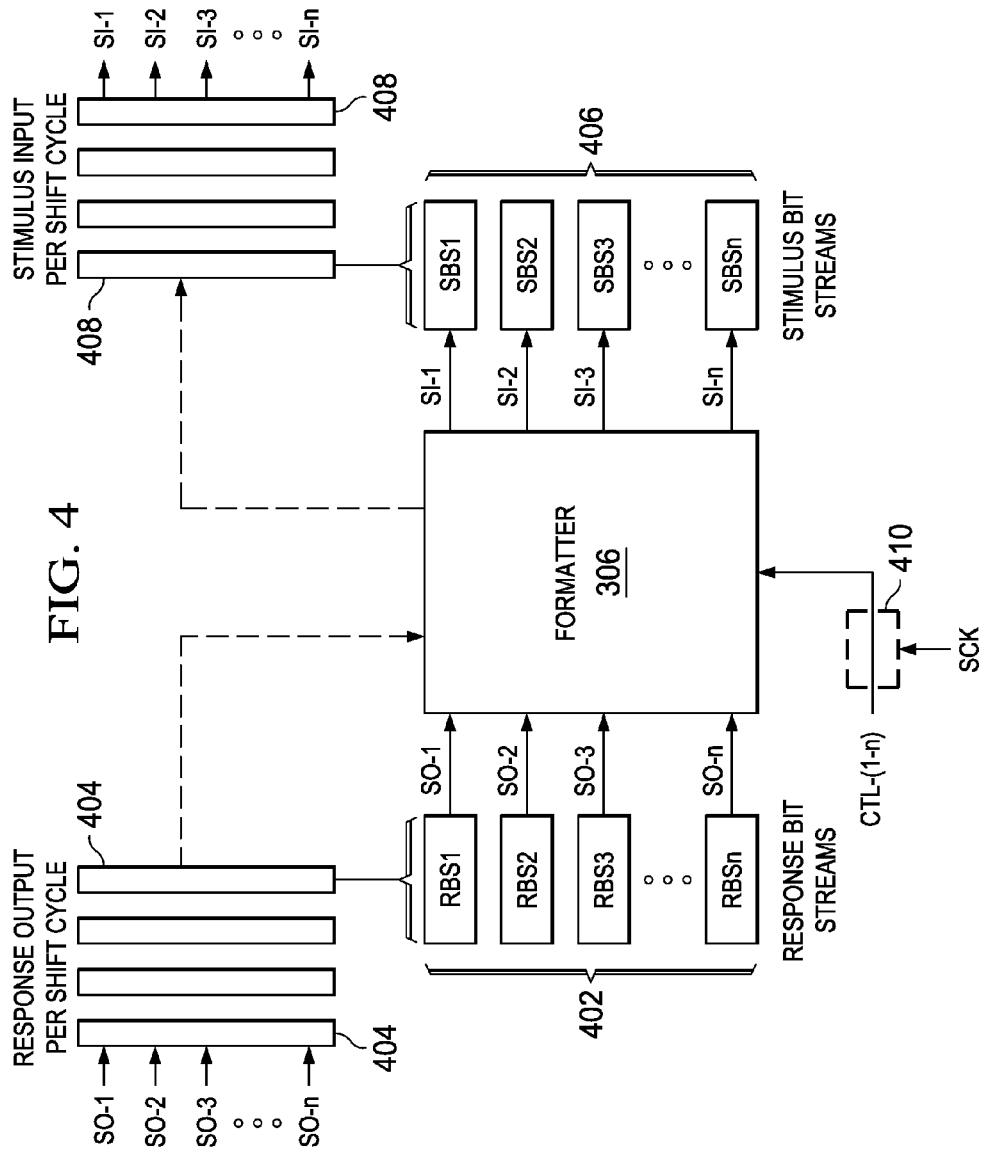
FIG. 4 illustrates a formatter circuit for reusing response data from a circuit to supply stimulus data to the circuit according to the disclosure.

FIG. 4 illustrates the formatter circuit 306 in more detail. The response bit streams (RBS1-$n$) 402 of each response output shift cycle 404 from circuit 301 are input to the formatter via SO-1-$n$. The formatter responds to the CTL-(1-$n$) inputs from the tester to format the response bit streams into stimulus bit streams (SBS1-$n$) 406 which are input to circuit 301 during each stimulus input shift cycle 408. If desired the CTL-(1-$n$) inputs from the tester can be registered by the SCK prior to being input to the formatter circuit 306, as seen in dotted line area 410.

FIGS. 5A-5D illustrate, according to the disclosure, the operation of each section 502-508 of formatter circuit 306 in producing stimulus bit streams (SBS1-n) from response bit streams (RBS1-n).

FIG. 5A illustrates formatter section 502 providing SBS1 inputs 406 for the SI-1 input of circuit 301 from RBS1-n outputs 402 of circuit 301 during a shift cycle. As the RBS1-n outputs are input to formatter section 502, the CTL-1 input from tester 300 switches to select certain bit segments 510 (A-L) that naturally occur in the RBS1-n outputs 402 of a "good" circuit 301 to provide the needed SBS1 to the SI-1 input of circuit 301. The need for stimulus input on the SI-1 input of circuit 301 is hereby, and according to the disclosure, satisfied merely by the reuse of response outputs on SO-1-n of circuit 301.

FIG. 5B illustrates formatter section 504 providing SBS2 inputs 406 for the SI-2 input of circuit 301 from RBS1-n outputs 402 of circuit 301 during a shift cycle. As the RBS1-n outputs are input to formatter section 504, the CTL-2 input from tester 300 switches to select certain bit segments 510 (A-L) that naturally occur in the RBS1-n outputs 402 of a "good" circuit 301 to provide the needed SBS2 to the SI-2 input of circuit 301. The need for stimulus input on the SI-2 input of circuit 301 is hereby, and according to the disclosure, satisfied merely by the reuse of response outputs on SO-1-n of circuit 301.

FIG. 5C illustrates formatter section 506 providing SBS3 inputs 406 for the SI-3 input of circuit 301 from RBS1-n outputs 402 of circuit 301 during a shift cycle. As the RBS1-n outputs are input to formatter section 506, the CTL-3 input from tester 300 switches to select certain bit segments 510 (A-L) that naturally occur in the RBS1-n outputs 402 of a "good" circuit 301 to provide the needed SBS3 to the SI-3 input of circuit 301. The need for stimulus input on the SI-3 input of circuit 301 is hereby, and according to the disclosure, satisfied merely by the reuse of response outputs on SO-1-n of circuit 301.

FIG. 5D illustrates formatter section 508 providing SBSn inputs 406 for the SI-n input of circuit 301 from RBS1-n outputs 402 of circuit 301 during a shift cycle. As the RBS1-n outputs are input to formatter section 508, the CTL-n input from tester 300 switches to select certain bit segments 510 (A-L) that naturally occur in the RBS1-n outputs 402 of a "good" circuit 301 to provide the needed SBSn to the SI-n input of circuit 301. The need for stimulus input on the SI-n input of circuit 301 is hereby, and according to the disclosure, satisfied merely by the reuse of response outputs on SO-1-n of circuit 301.

The bit segments 510 of FIGS. 5A-5D may contain any number of bits. Also while this example shows using 12 bit segments A-L, any number of bit segments may be used to produce a required stimulus bit stream.

FIG. 6A illustrates that a multiplexer 602 can be used to implement the formatter section 502 of FIG. 5A. The multiplexer has inputs connected to the SO-1-n outputs of circuit 301, control inputs connected to the CTL-1 input from tester 300, and an output connected to the S1-1 input of circuit 301. The formatter sections 504-508 of FIGS. 5B-5D can similarly be implemented with multiplexers 602. In addition to multiplexers, other types of switching circuits could be used to implement formatter sections as well. If desired, and as shown in dotted line, each multiplexer 602 of a formatter may include additional inputs for a fixed logic one and logic zero. This would allow always being able to select a logic level that may not appear in any of the response bit streams (RBS1-n) 402. However with a sufficient number of response bit streams (RBS1-n) 402 input to the multiplexer 602 it is very likely that a fixed logic level will always be available from one of the SO1-n outputs 108 of circuit 301.

FIG. 6B illustrates times 606 when the CTL-1 input to multiplexer 602 is switched by the tester 300 to select a response bit segment 510 (A-L) to be output from multiplexer 602 to form a formatted serial bit stream 604 for input to the SI-1 input circuit 301 during a shift cycle. As seen, the tester 300 only needs to switch the CTL-1 input to multiplexer 602, at times 606, whenever it is necessary to select the next response bit segment 510 to be output to the SI-1 input of circuit 301. As seen, the A segment from RBS1 402 includes a single bit, the B section of RBS3 402 includes plural bits, and so on through L which includes plural bits.

FIG. 6C illustrates the same stimulus bit stream 604 being provided on the SI-1 input of circuit 100 from the stimulus data memory 204 of tester 200 of FIG. 2. As seen, the tester 200 must output a stimulus bit from memory 204 during each SCK of a shift cycle, i.e. at times 608, to provide the stimulus bit stream to SI-1 of circuit 100.

As can be seen in comparing the number of CTL-1 timing outputs 606 from the control memory 302 of tester 300 to the number of stimulus bit timing outputs 608 from the stimulus data memory 204 from tester 200 to produce the stimulus bit stream 604, the control memory 302 of tester 300 needs to output a significantly less number of timings than the stimulus data memory 204 of tester 200. Therefore the control memory 302 can be much smaller than the stimulus data memory 204. Also since the control timings 606 are output at a lower rate than the stimulus bit timings 608, the control memory 302 does not have to be a high speed memory, as does stimulus data memory 204. Being able to use a smaller lower speed control memory 302 reduces the cost of tester 300, and therefore the cost of the product being tested.

Figure 7:
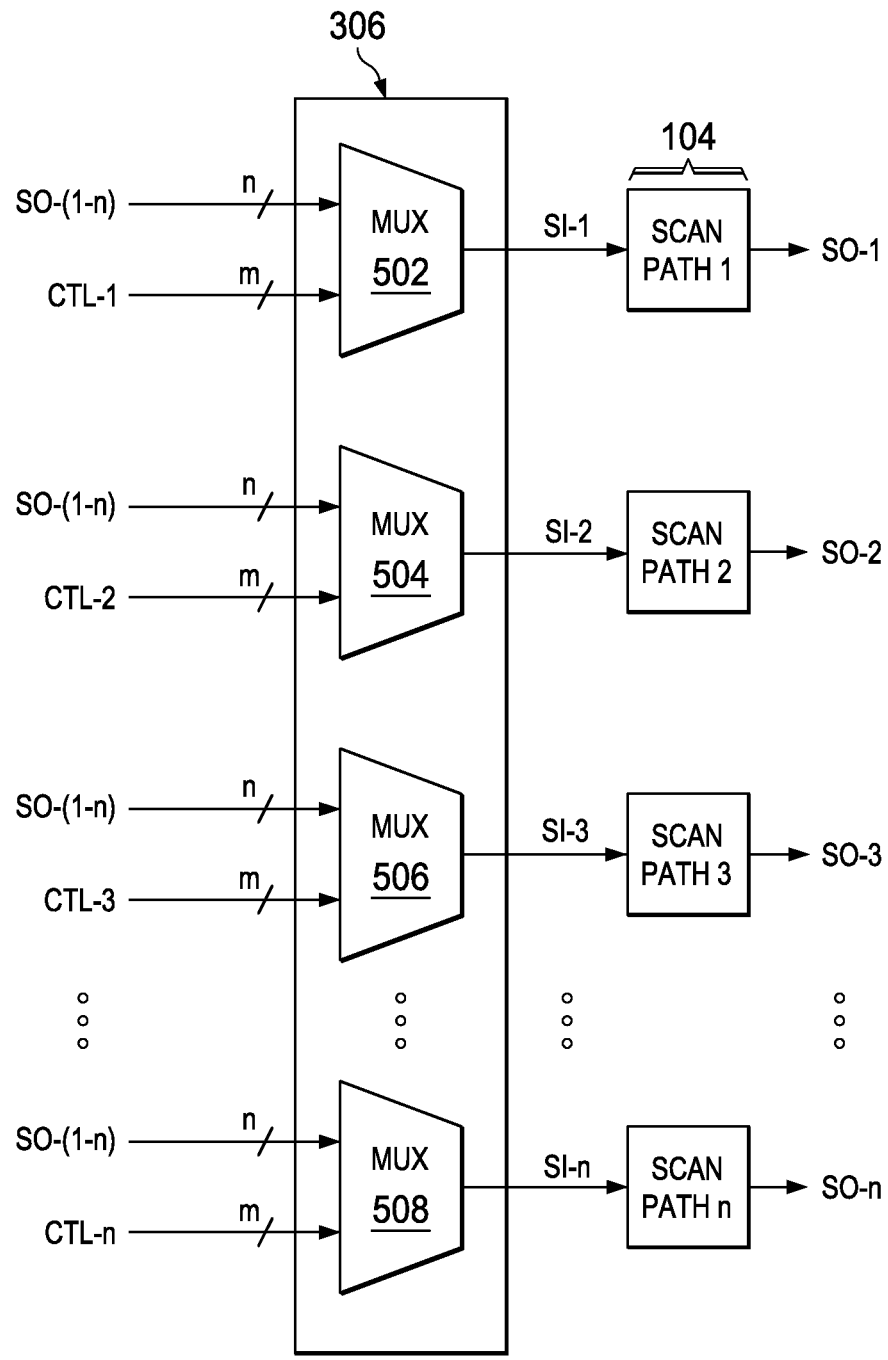
FIG. 7 illustrates a stimulus data formatter with independently controlled multiplexer sections according to the disclosure.

FIG. 7 illustrates a formatter circuit 306 providing formatted stimulus data to "n" scan paths 104. In this and following example Figures, the multiplexers 303 that exist between the formatter 306 outputs 310 and the scan path 104 inputs 106 are not shown for simplification. As seen, the formatter 306 includes "n" multiplexers 502-508 each having an output coupled to one of the "n" scan path inputs and each having inputs coupled to the "n" scan path outputs. Each multiplexer is controlled by a separate "m" signal wide control bus (CTL1-n) from tester 300. Having separate control buses for each multiplexer allows the tester to operate each multiplexer independently to produce formatted stimulus input to its associated scan path. However, and as can be seen, a large number of "m" signal wide control buses are required to be input to the formatter 306 from the tester 300 to allow selecting each of the "n" scan path outputs. For example, if 16 scan paths are used in the example of FIG. 7, the control bus input to each multiplexer would need to be 4 signals wide to allow for selecting any of the serial outputs (SO-1-16) of the 16 scan paths, which would require 64 control signals from tester 300.

It should be understood that while the example of FIG. 7 shows all "n" scan path outputs being coupled to multiplexers 502-508, that need not always be the case. Indeed, it may be possible to produce stimulus data to a scan path using a fewer number of scan path outputs. For example, if the stimulus input to scan path 1 can be satisfied by using only the scan outputs of scan paths 1, 3, 5 and n, the number of control inputs to multiplexer 502 can be reduced down to 2. Likewise, if the stimulus input to the other scan paths 2-n can be similarly satisfied by using only four of the scan path outputs, the number of control inputs from tester 300 can be significantly reduced.

Figure 8:
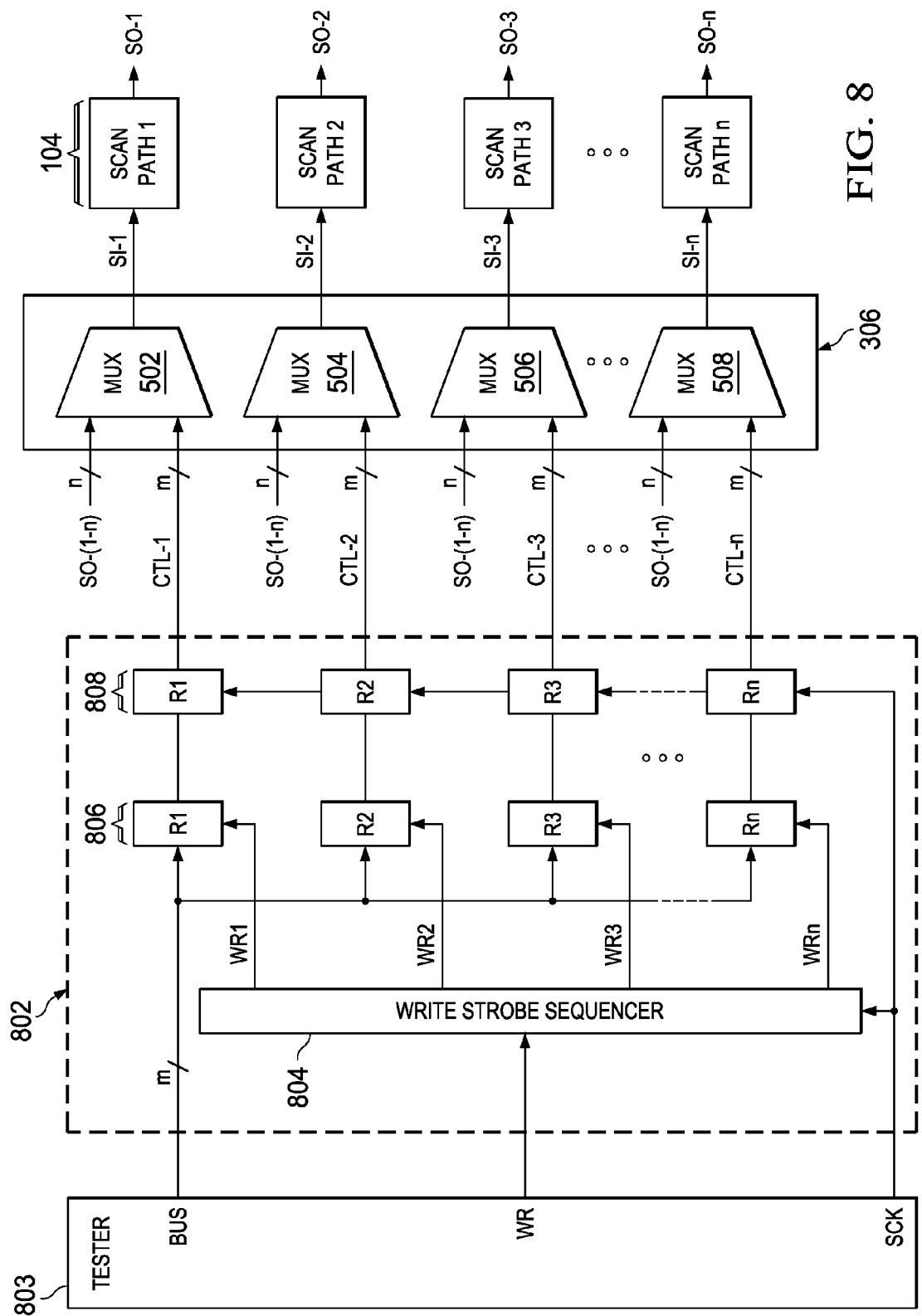
FIG. 8 illustrates the formatter of FIG. 7 being controlled by a write strobe sequencer circuit according to the disclosure.

FIG. 8 illustrates an example of how a circuit 802 can be used as an interface within a device under test, according to the disclosure, to allow reducing the number multiplexer 502-508 control inputs (CTL1-n) between a tester 803 and formatter 306. Circuit 802 comprises a write strobe sequencer 804, a first series of m-bit wide registers (R1-Rn) 806, and a second series of m-bit wide registers (R1-Rn) 808. The write strobe sequencer 804 receives a write strobe (WR) input and the SCK input from tester 803 and outputs separate write strobes (WR1-WRn) to each of the registers R1-Rn 806. Each R1-Rn register 806 has inputs for inputting data from an m-bit wide data bus from tester 803 and outputs for outputting m-bit wide data to a corresponding m-bit wide register R1-Rn 808. Each R1-Rn register 808 inputs the m-bit wide data from its corresponding R1-Rn register 806 and the SCK signal and outputs m-bit wide data to the control inputs (CTL1-n) of formatter multiplexers 502-508.

When WR strobes are input from tester 803, the write strobe generator sequences its WR1-WRn outputs to cause R1-Rn registers 806 to sequentially load data from tester 803 via the m-bit wide data bus. When data has been loaded into each of R1-Rn registers 806, the tester outputs an SCK to cause the data in R1-Rn registers 806 to be transferred into R1-Rn registers 808 to be applied to the formatter control inputs (CTL1-n). Also in response to SCK the write strobe sequencer 804 is initialized to prepare it for a subsequent WR strobe input sequence from the tester.

Figure 8A:
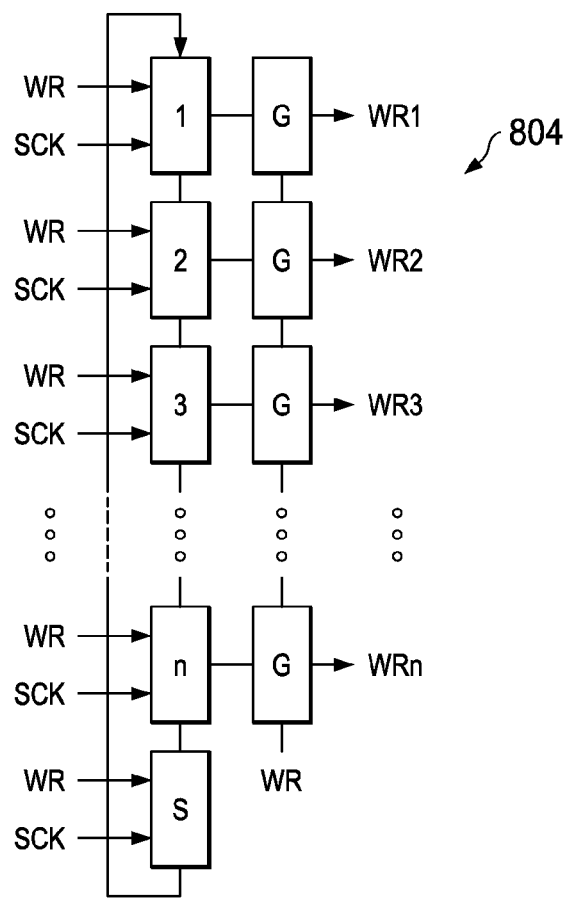
FIG. 8A illustrates an example implementation of the write strobe sequencer circuit of FIG. 8 according to the disclosure.

FIG. 8A illustrates one example implementation of the write strobe sequencer 804. As seen the write strobe sequencer 804 includes a circular shift register comprising flips flops (FF) 1-n, a start bit (S) FF, and gating (G) circuitry. In response to an SCK input FFs 1-n are set to a logic low and FF S is set to a logic high start bit. When WR strobes occur the logic high start bit in FF S is circulated through each FF 1-n. Each time a FF 1-n receives the logic high start bit its associated gate (G) is enabled to pass a WR strobe signal from the tester to an associated R1-Rn register 806 via write strobes WR1-WRn. This process of initializing the circular shift register then circulating a start bit through it to produce write strobes WR1-WRn is repeated between each occurrence of the SCK signal.

FIG. 9 illustrates another example of how a circuit 902 can be used as an interface within a device under test, according to the disclosure, to allow reducing the number multiplexer 502-508 control inputs (CTL1-n) between a tester 903 and formatter 306. Circuit 902 comprises a write strobe addressing circuit 904, a first series of m-bit wide registers (R1-Rn) 806, and a second series of m-bit wide registers (R1-Rn) 808. The write strobe addressing circuit 904 receives a write strobe (WR) input and address (ADD) inputs from tester 903 and outputs separate write strobes (WR1-WRn) to each of the registers R1-Rn 806. Each R1-Rn register 806 has inputs for inputting data from an m-bit wide data bus from tester 903 and outputs for outputting m-bit wide data to a corresponding m-bit wide register R1-Rn 808. Each R1-Rn register 808 inputs the m-bit wide data from its corresponding R1-Rn register 806 and the SCK signal and outputs m-bit wide data to the control inputs (CTL1-n) of formatter multiplexers 502-508.

When a WR strobe is input from tester 803, the address (ADD) input to write strobe addressing circuit 904 directs the write strobe to one of the write strobe outputs WR1-WRn which causes an associated R1-Rn register 806 to load data from tester 903 via the m-bit wide data bus. When data has been loaded into one or more of the R1-Rn registers 806, the tester outputs an SCK to cause the data in R1-Rn registers 806 to be transferred into R1-Rn registers 808 to be applied to the formatter control inputs (CTL1-n). As can be seen, circuit 902 differs from circuit 802 in that only addressed registers R1-Rn 804 are loaded with data between SCK occurrences as opposed to sequentially loading all registers R1-Rn 804 with data between SCK occurrences. This is advantageous since not all registers R1-Rn 806 may need to be loaded with data between occurrences of SCKS.

Figure 9A:
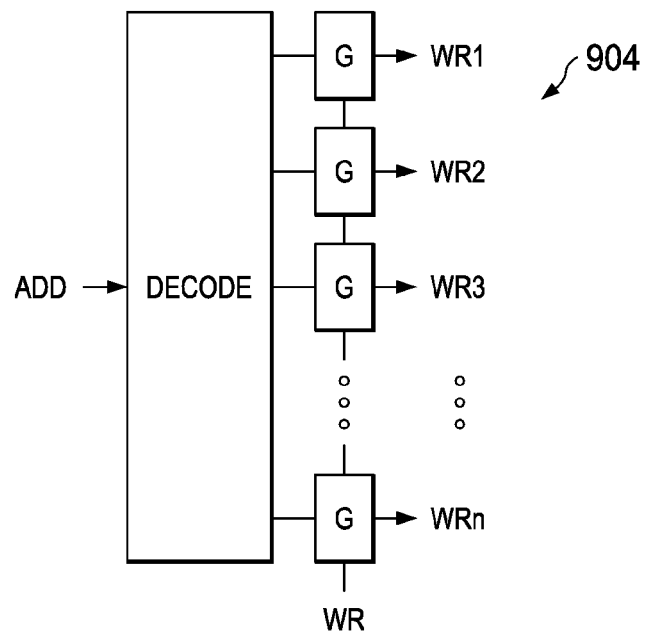
FIG. 9A illustrates an example implementation of the addressable write strobe circuit of FIG. 9 according to the disclosure.

FIG. 9A illustrates one example implementation of the write strobe addressing circuit 904. As seen the write strobe addressing circuit 904 includes an address decoder and gating (G) circuitry. In response to the address (ADD) input the decoder enables one of the gating (G) circuits to pass a WR strobe signal from the tester to an associated R1-Rn register 806 via write strobes WR1-WRn. This process of inputting an address then passing a write strobe to an addressed register R1-Rn 806 is repeated between each occurrence of the SCK signal.

While FIGS. 8, 8A, 9, and 9A have illustrated ways to reduce the width of the control (CTL1-n) inputs to formatter 306, other ways may be used. For example, well known high speed SERDES (Serialize/De-serialize) interfaces could be used, as well as others such as high speed DDR (Double Date Rate) interfaces.

Figure 10:
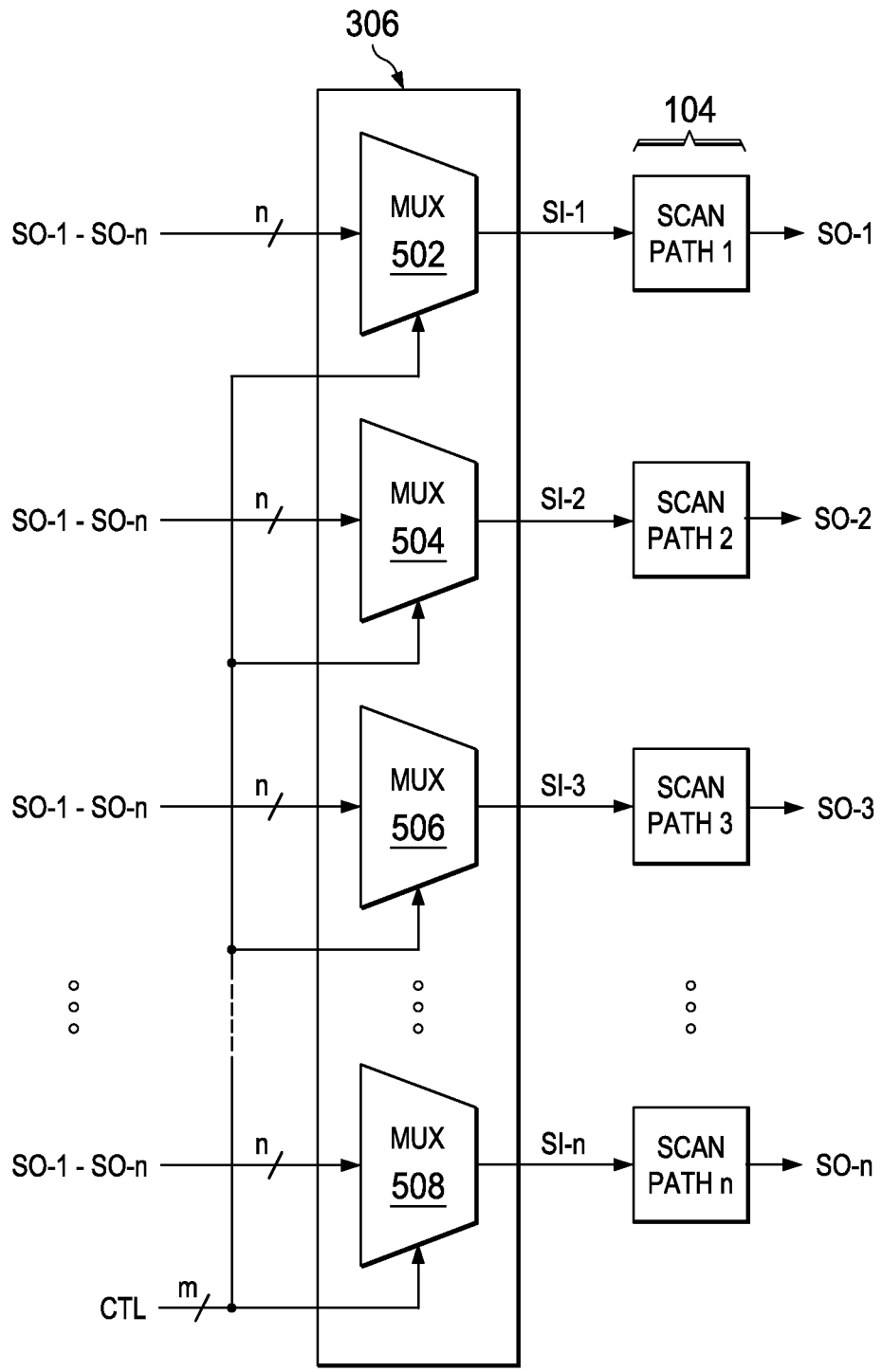
FIG. 10 illustrates a stimulus data formatter with commonly controlled multiplexer sections according to the disclosure.

FIG. 10 illustrates a formatter circuit 306 providing formatted stimulus data to "n" scan paths 104. As seen, the formatter includes "n" multiplexers 502-508 each having an output coupled to one of the "n" scan path inputs and each having inputs coupled to the "n" scan path outputs. Each multiplexer is controlled by a common "m" signal wide control bus (CTL) from a tester. Using a common "m" signal wide control bus for each multiplexer significantly reduces the number of control inputs from the tester as compared to the formatter circuit arrangement of FIG. 7. For example, if 256 scan paths are used in the example of FIG. 10, the common "m" signal wide control bus to each multiplexer 502-508 would need to only be 8 signals wide to allow for selecting any of the serial outputs (SO-1-256) of the 256 scan paths to be used to provide stimulus inputs to the 256 scan paths 104.

While the example of FIG. 10 shows all "n" scan path outputs being coupled to multiplexers 502-508, that need not always be the case. Indeed, it may be possible to produce stimulus data to scan paths 1-n using a fewer number of scan path serial outputs. For example, if the stimulus inputs to scan paths 1-n 104 can be satisfied by using only the scan outputs of a subset of the scan paths 1-n, the number of signal inputs on the common control bus can be reduced. For example, if 256 scan paths are used but only the serial outputs of 16 of the 256 scan paths are required to produce stimulus inputs to the 256 scan paths, the common control bus would require only 4 control inputs from a tester, instead of 8 control inputs.

Using a common control bus (CTL) as shown in FIG. 10 means that all multiplexer 502-508 control inputs to formatter 306 will be timed together. Also the control input to formatter 306 may occur for one or more SCK occurrences. The following describes one way of providing formatted stimulus inputs to scan paths when using a common formatter 306 control bus input.

Figure 11:
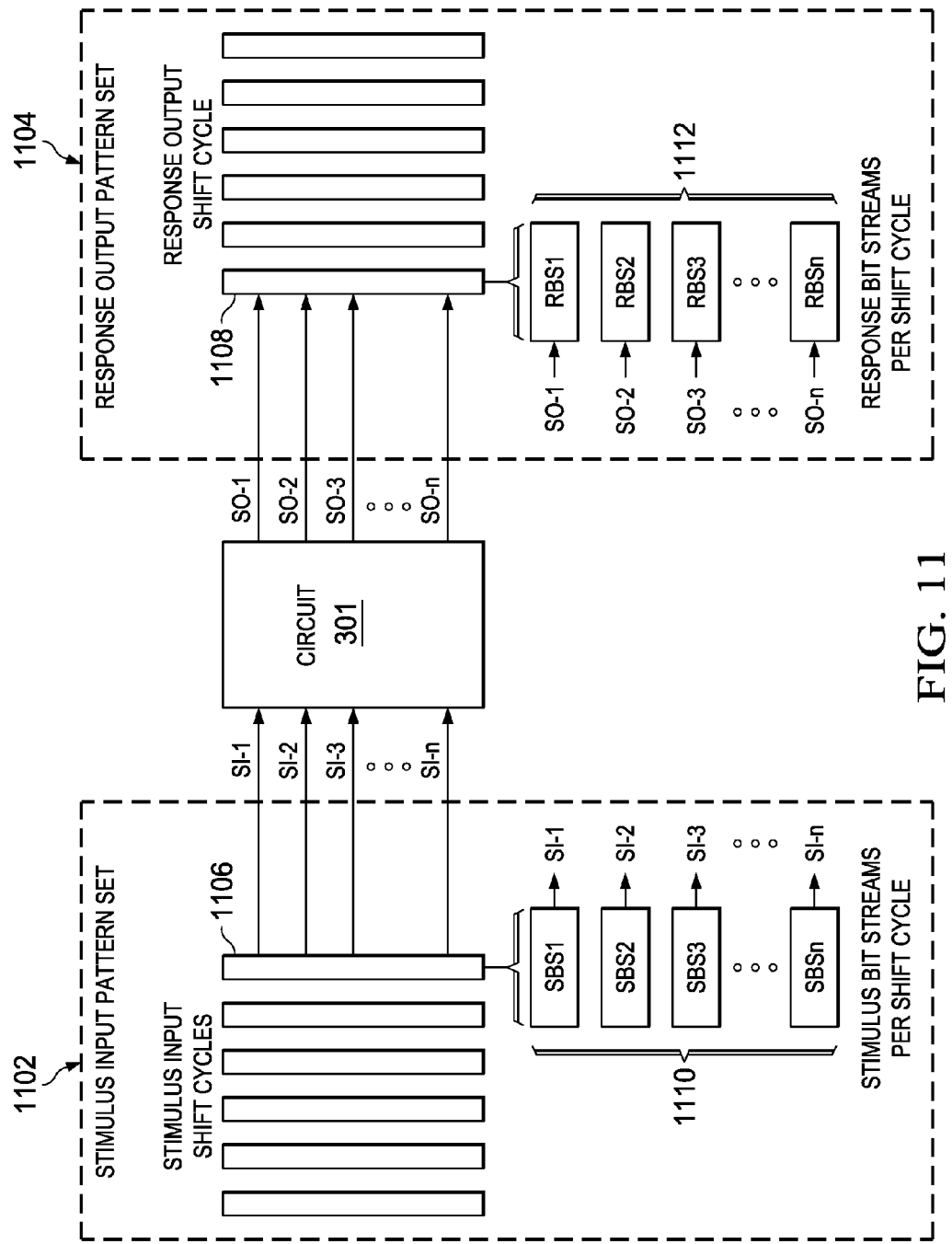
FIG. 11 illustrates a circuits stimulus input pattern set and response output patterns set generated by an automatic test pattern generation tool.

FIG. 11 illustrates the results of running a conventional automatic test pattern generation (ATPG) software tool, which is provided by various design automation companies, on a circuit 100 within a circuit 301 to produce a stimulus input pattern set 1102 that will provide a desired response output pattern set 1104 from the circuit 100 within circuit 301 to be scan tested. The stimulus input pattern set 1102 comprises stimulus inputs that will be input to circuit 100 within circuit 301 during each shift cycle 1106. Each stimulus input 1106 comprises stimulus bit streams 1-n (SBS1-n) 1110 for each serial input (SI1-n) to the scan paths 1-n 104 of circuit 100. The response output pattern set 1104 comprises response outputs that will be output from circuit 100 within circuit 301 during each shift cycle 1108. Each response output 1108 comprises response bit streams 1-$n$ (RBS1-$n$) 1112 that are expected to be output on the serial outputs (SO1-$n$) of each scan path 1-$n$ 104 of circuit 100 within circuit 301.

As will be described in FIG. 12, this disclosure describes a process for analyzing the response output pattern set 1104 of circuit 301 to produce a stimulus input pattern set 1102 to circuit 301 via a formatter circuit 306 that uses the common control bus (CTL) approach described in regard to FIG. 10. The process involves the steps of analyzing each response bit stream 1112 of each response output 1108 to find response bit stream segments that can be formatted, via a formatter 306, and used as stimulus inputs 1106 to circuit 301.

Figure 12A:
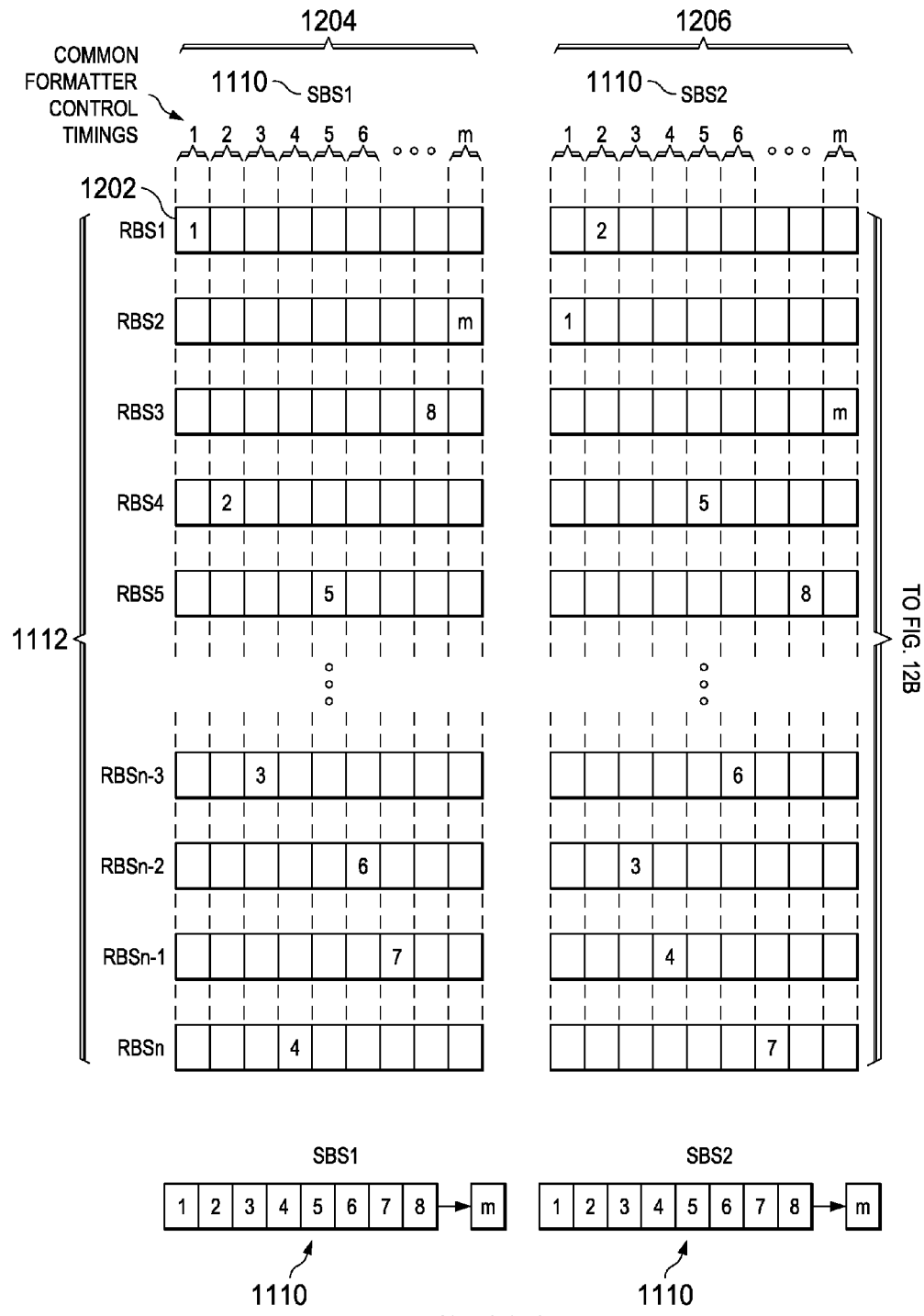
FIGS. 12A and 12B illustrate the process of producing stimulus inputs from response outputs using common control bus timings according to the disclosure.
Figure 12B:
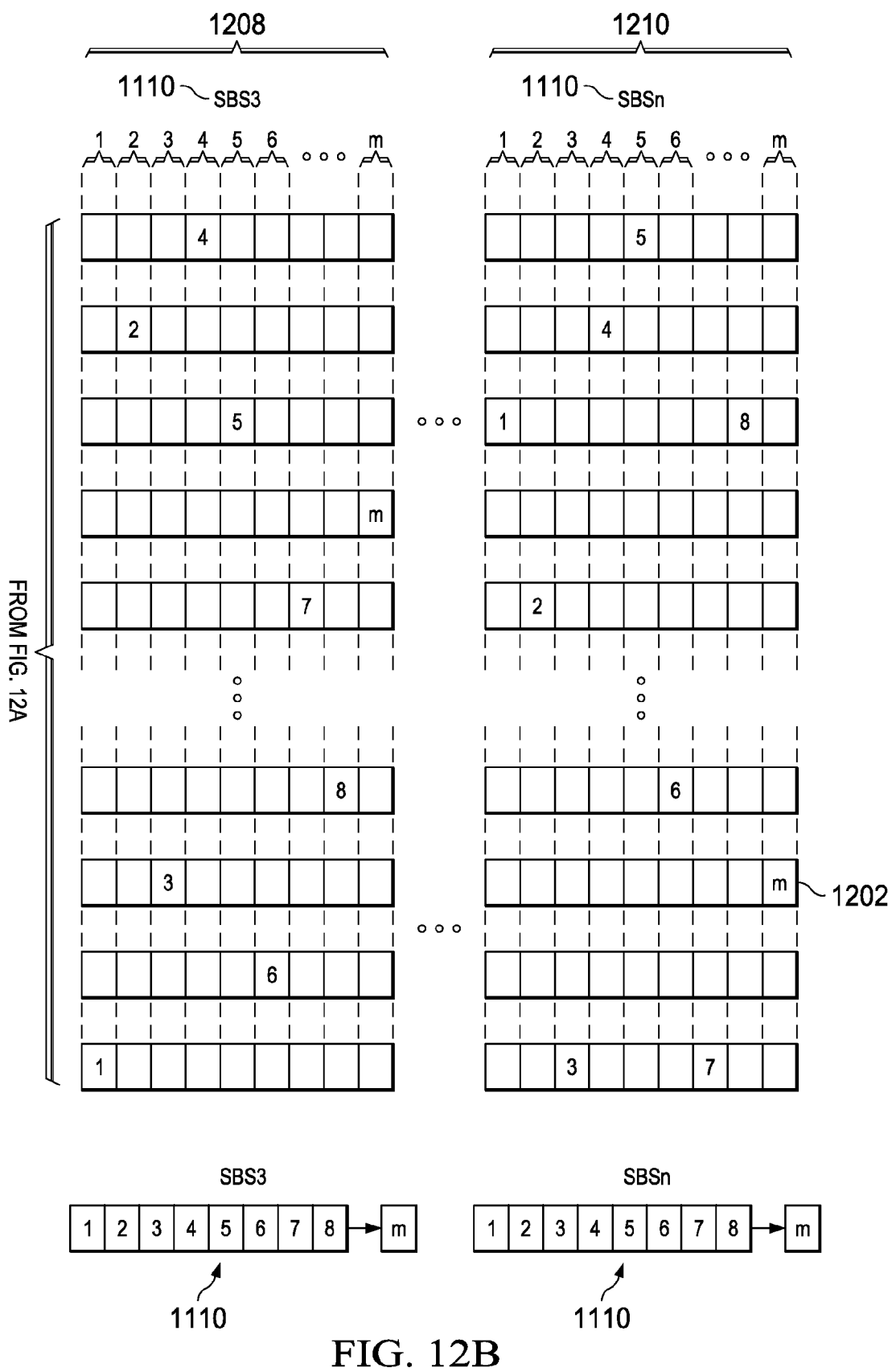

FIG. 12 illustrates the process of analyzing the response bit streams 1-$n$ (RBS1-$n$) 1112 of a response output 1108 of a circuit 301 during a shift cycle 1108 to provide stimulus bit streams 1-$n$ (SBS1-$n$) 1110 that can be used to provide a stimulus input 1106 to circuit 301 during a shift cycle 1106. As seen, common formatter control timings 1-$m$ from the control bus (CTL) of FIG. 10 are established that partition the RBS1-$n$ into segments 1202. During each control timing 1-$m$, the segments 1202 of each RBS1-$n$ output are analyzed to find response bit segments 1202 that can be used as SBS1-$n$ inputs 1112 to circuit 301. For example, the SBS1 input to circuit 301 is shown in column 1204 being formed by using bit segment 1 1202 from RBST, bit segment 2 1202 from RBS4, bit segment 3 1202 from RBSn-3, bit segment 4 1202 from RBSn, bit segment 5 1202 from RBS5, bit segment 6 1202 from RBSn-2, bit segment 7 1202 from RBSn-1, bit segment 8 1202 from RBS3, and on to bit segment "m" 1202 from RBS2. Similarly the SBS2-$n$ inputs to circuit 301 are shown in columns 1206-1210 being similarly formed by using bit segments 1202 of the RBS1-$n$ outputs.

Any number of control timings 1-$m$ can be used. Also each of the control timings 1-$m$ can provide bit segments 1202 that contain one or more response bits. Further, the response bit segments 1202 may be selected from all the RBS1-$n$ outputs or from only a subset of the RBS1-$n$ outputs. The process described above is repeated on the RBS1-$n$ 1112 of each response output 1108 of circuit 301 to produce the desired SBS1-$n$ 1110 for each stimulus input 1106 to circuit 301.

It should be understood at this point and going forward that as the number of shorter length parallel scan paths increases, a greater opportunity exists to "mine for" response bits that can be used as stimulus bits and, as will be described later, expected data bits. Thus the efficiency of the disclosure increases as the number of parallel scan paths increases. This naturally follows a trend in scan testing today whereby the use of a larger number of shorter length parallel scan path arrangements is extremely desirable, since that leads to a significant reduction in test time due to shorter shift cycle times.

Figure 13:
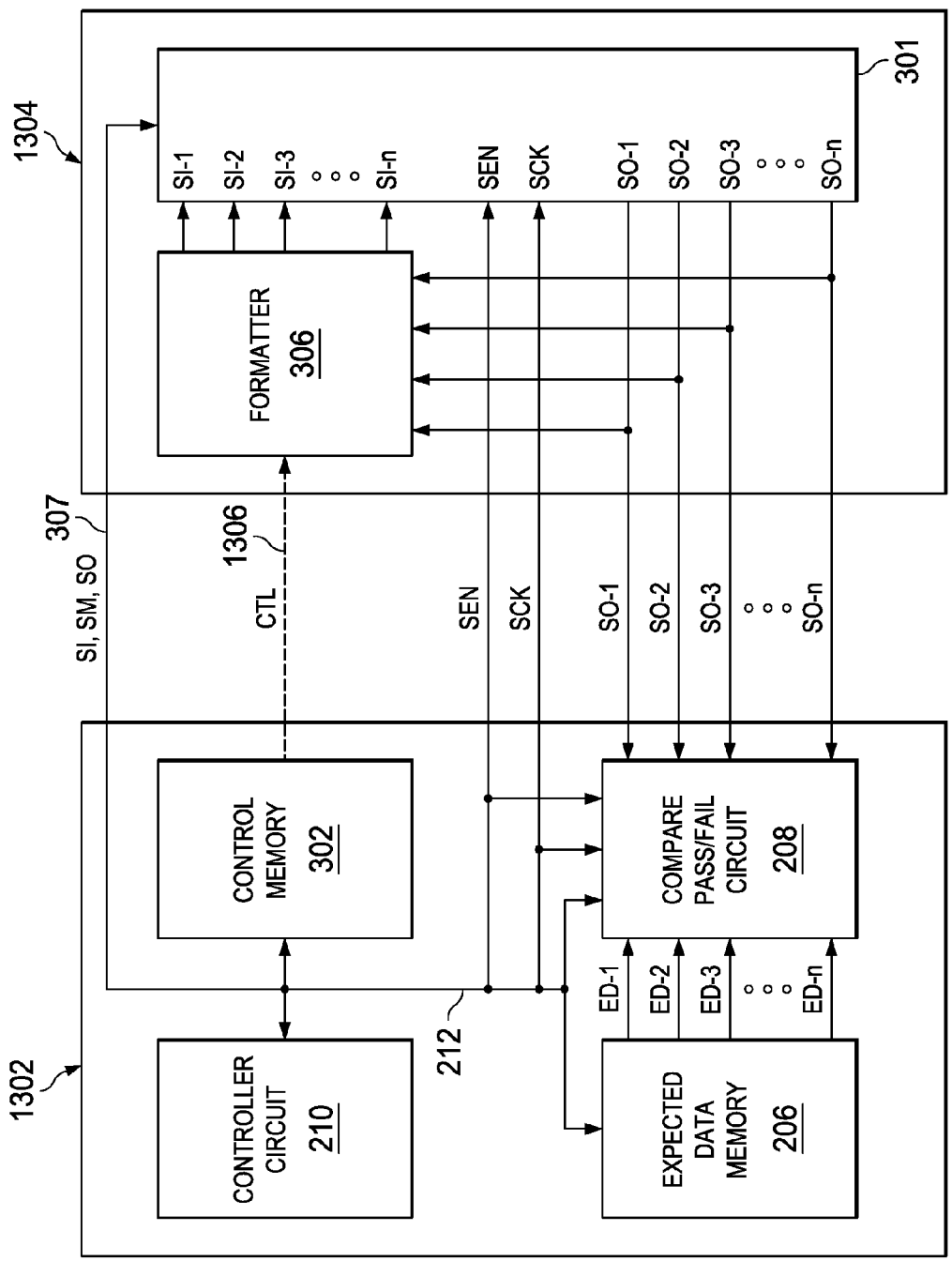
FIG. 13 illustrates an arrangement between a tester and a circuit under test using any one of the formatter control interfaces of FIGS. 7, 8, 9 and 10 according to the disclosure.

FIG. 13 is provided to illustrate that the control input 1306, in dotted line, from a tester 1302 to a formatter 306 of a circuit 1304 can be achieved using any of the methods described and shown in regard to FIGS. 3, 7, 8, 9 and 10, i.e. by using the separate control buses (CTL1-$n$) of FIGS. 3 and 7, by using circuit 802 of FIG. 8, by using circuit 902 of FIG. 9, or by using the common control bus (CTL) of FIG. 10.

Figure 14:
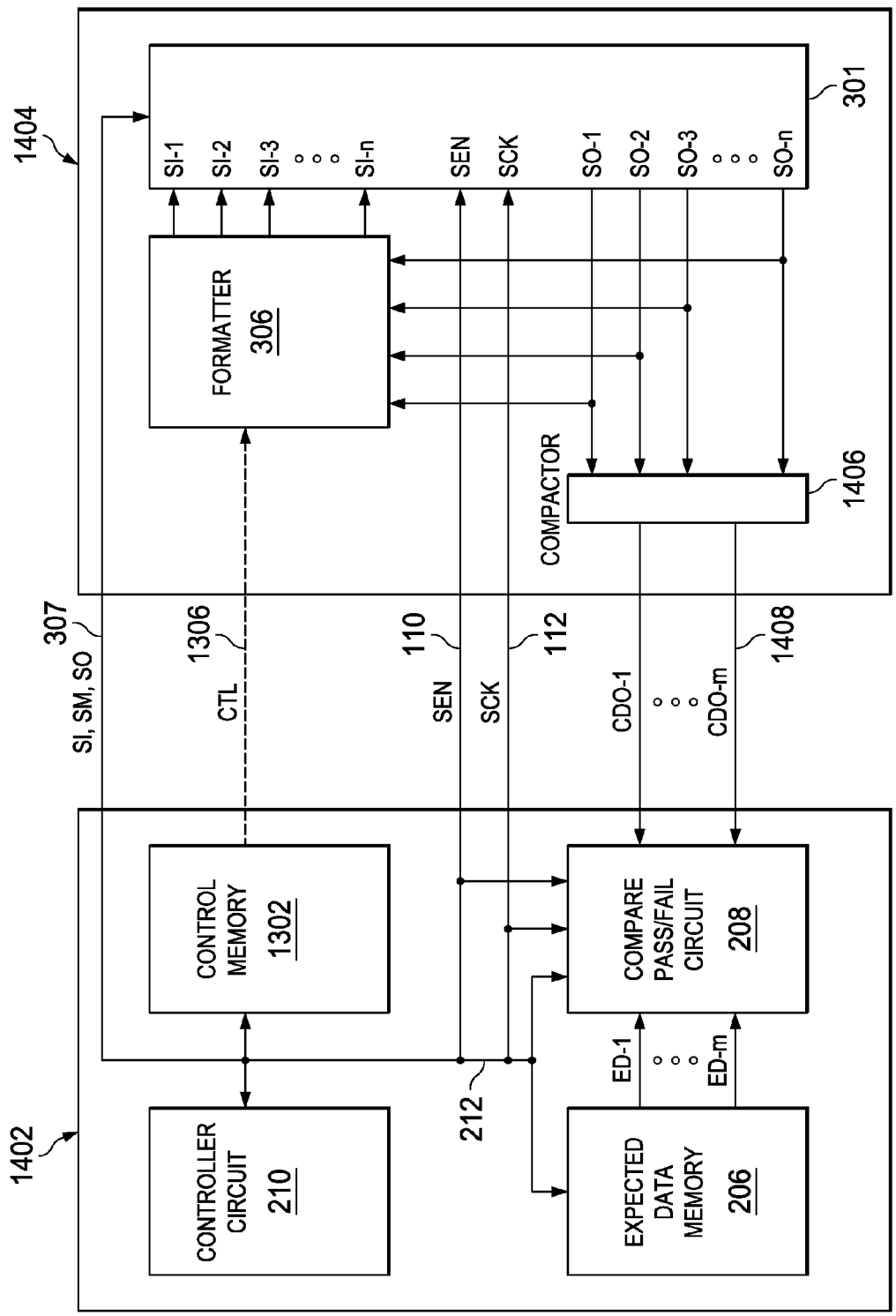
FIG. 14 illustrates the use of a formatter circuit in combination with a compactor circuit according to the disclosure.

FIG. 14 illustrates the formatter circuit 306 being used in combination with a compactor circuit 1406, according to the disclosure. Compactor circuits 1406 serve to compact a large number of scan outputs (SO1-$n$) from a circuit 301 down to a smaller number of compacted data outputs (CDO1-$n$) 1408 which are output to a tester 1402. Compactor circuits 1406 are well known in the test industry and are typically realized using exclusive OR (XOR) gate trees that input a large number of scan outputs from a circuit 301, XOR the scan outputs together, and output a resulting one or more compacted data outputs (CDO1-$n$) 1408 to a tester.

Figure 15:
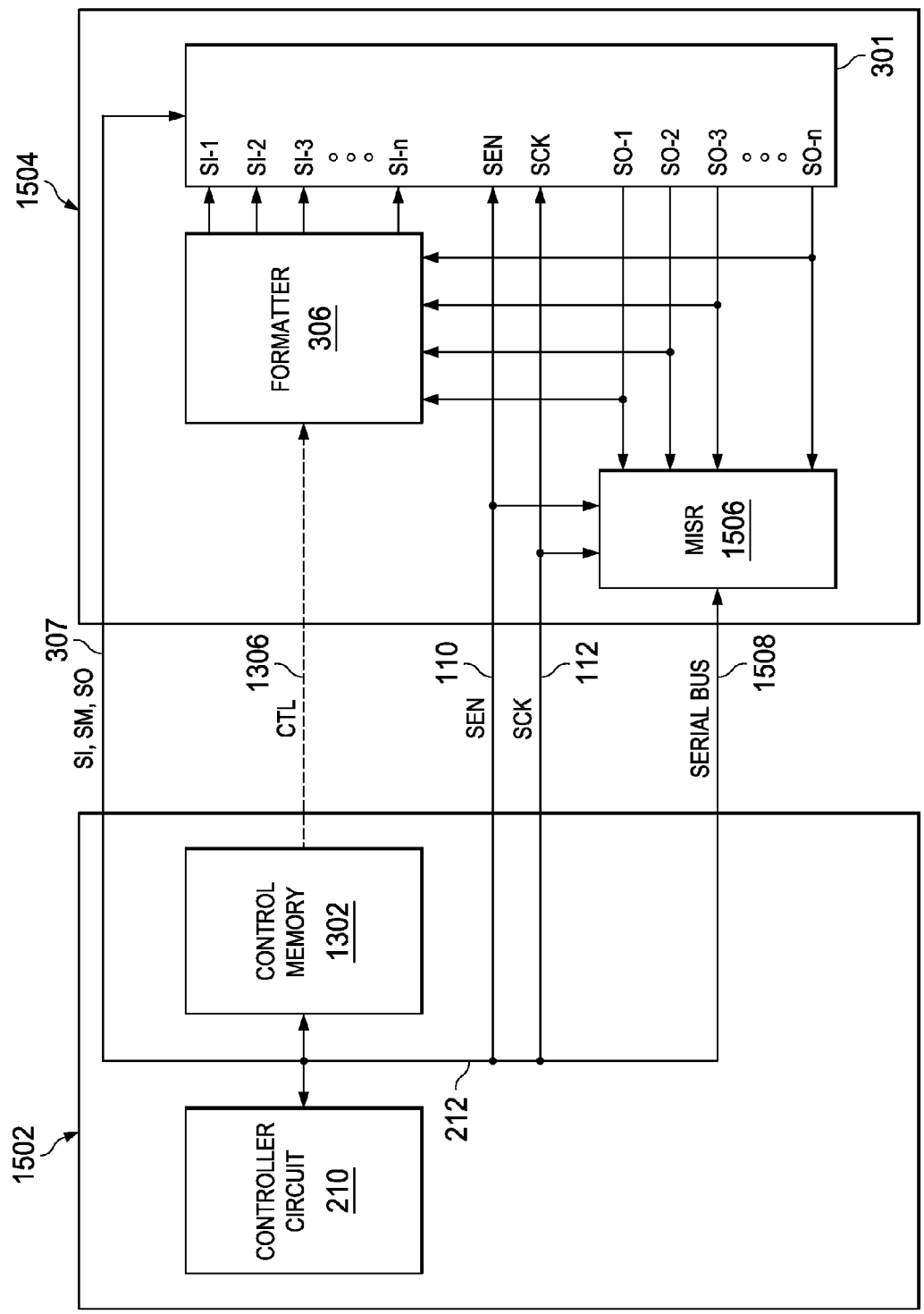
FIG. 15 illustrates the use of a formatter circuit in combination with a MISR circuit according to the disclosure.

FIG. 15 illustrates the formatter circuit 306 being used in combination with a multiple input signature register (MISR) circuit 1506, according to the disclosure. MISR circuits 1506 serve to compress the scan outputs (SO1-$n$) from a circuit 301 into a signature in response to SEN and SCK control inputs from the tester. At the end of test, the signature is sent to the tester 1502 via a serial bus 1508 which may be a JTAG serial bus. MISR circuits 1506 are well known in the test industry and are typically realized using linear feedback shift registers which input the scan outputs and compress them into a signature. The tester's control circuit 210 inputs the signature after the test completes, via bus 1508 of bus 212, and determines whether it matches an expected signature.

Figure 16:
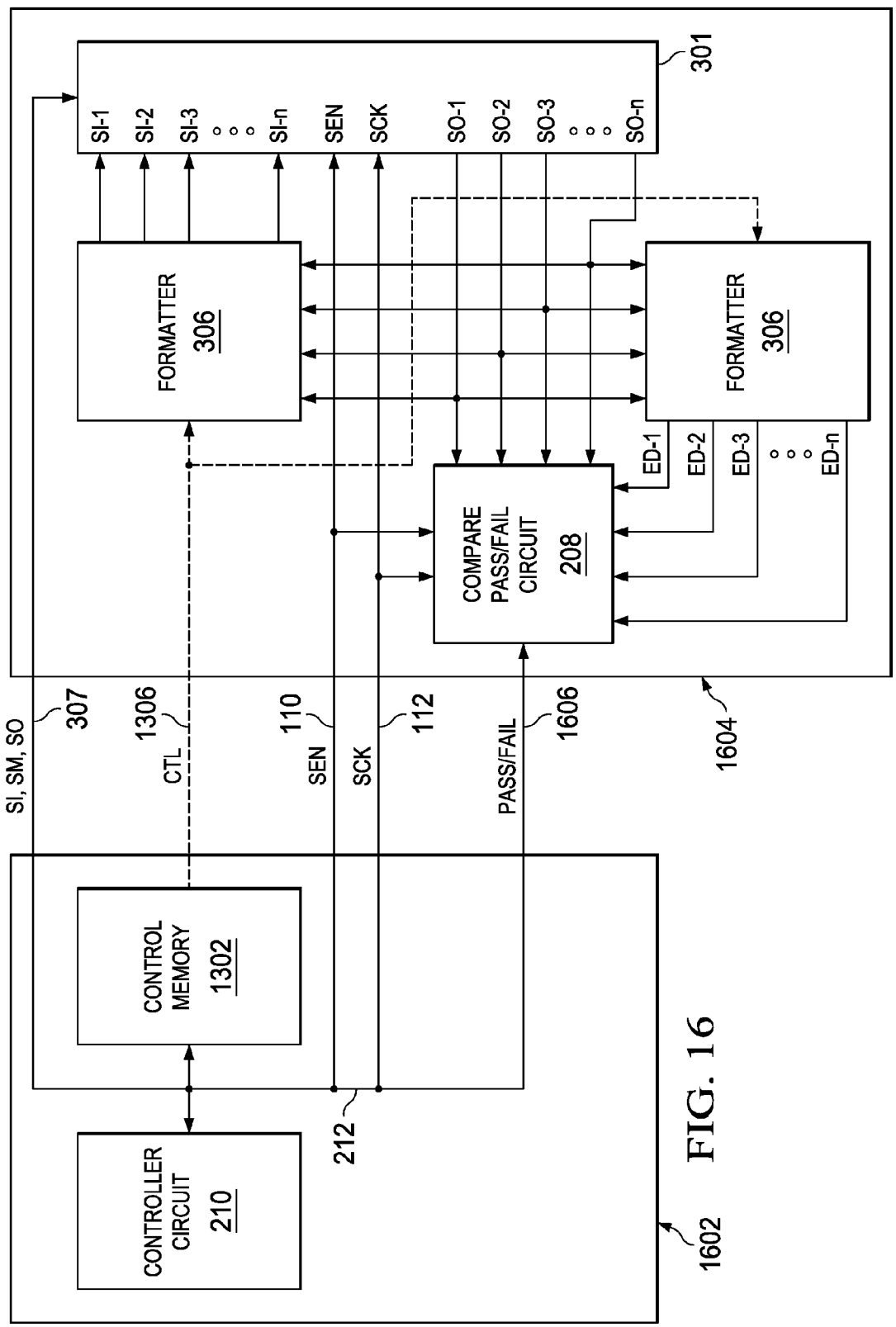
FIG. 16 illustrates a device containing a first formatter for providing stimulus data and a second formatter for providing expected data according to the disclosure.

FIG. 16 illustrates another aspect of the disclosure whereby a second formatter circuit 306 is used in a device 1604 to provide expected data (ED1-$n$) inputs to a compare pass/fail circuit 208 which is also used in the device 1604. Incorporating the expected data formatter 306 and compare pass/fail circuit 208 into the device reduces the complexity of the tester 1602 since it eliminates the need of the tester 1602 to have a compare pass/fail circuit 208 and expected data memory 206 as shown in FIG. 3. Also as can be seen, the number of interconnects between the tester 1602 and the device 1604 is reduced to only needing a CTL bus 1306, the SEN 110 and SCK 112 signals, the serial interface 307, and a pass/fail bus 1606, which may be a JTAG bus that already exists on the device 1604. The expected data formatter 306 is controlled by the tester 1602 via a control bus 1306. The control bus 1306 to the expected data formatter 306 may be the same control bus 1306 that controls the stimulus data formatter 306 or it may be a separate control bus 1306.

Figure 17:
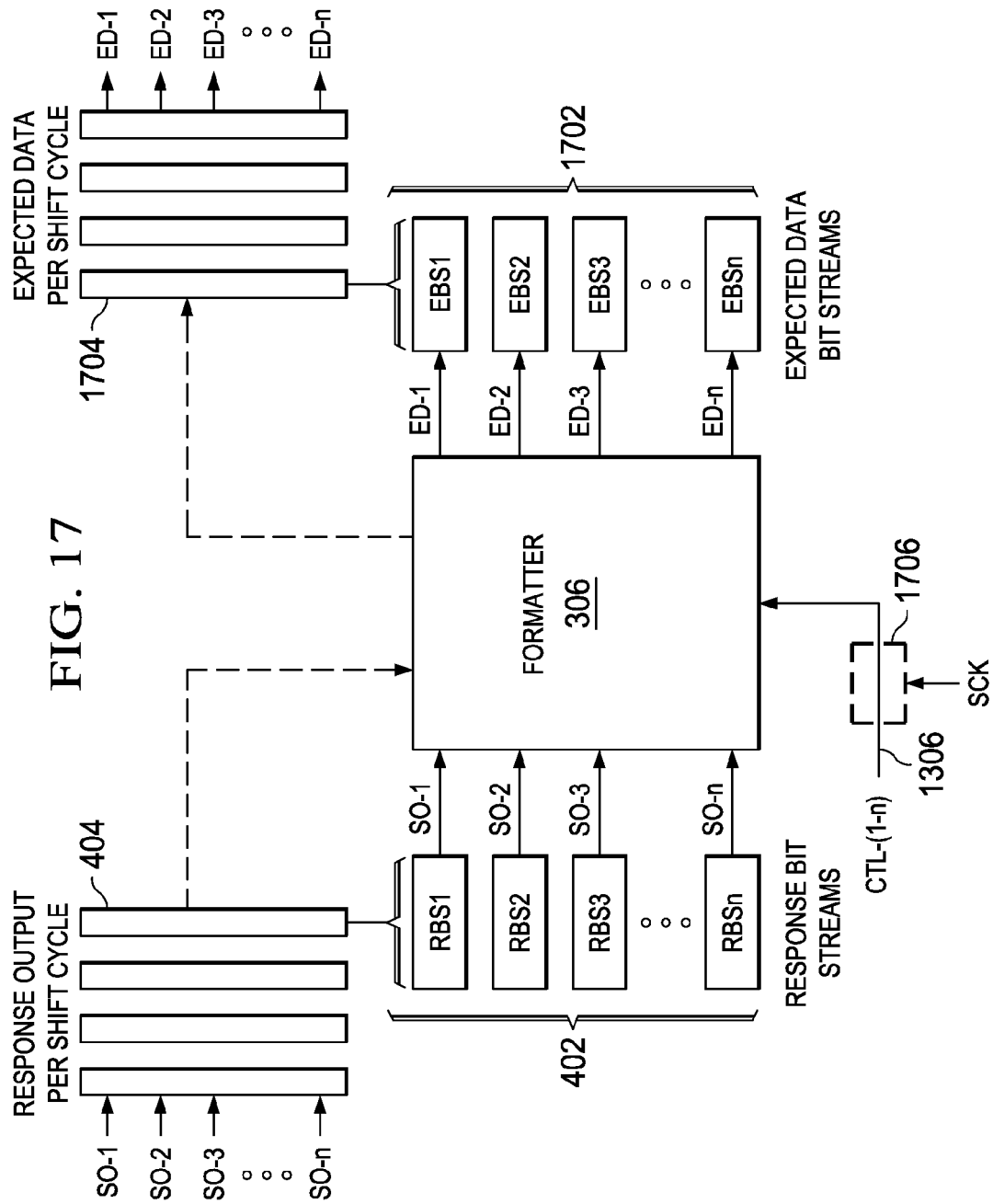
FIG. 17 illustrates a formatter circuit for reusing response data from a circuit to supply expected data according to the disclosure.

FIG. 17 illustrates the expected data formatter circuit 306 in more detail. The response bit streams (RBS1-$n$) 402 of each response output shift cycle 404 from circuit 301 are input to the expected data formatter via SO-1-$n$. The expected data formatter responds to the CTL-(1-$n$) inputs 1306 from the tester to format the response bit streams into expected data bit streams (EBS1-$n$) 1702 which are input to the compare pass/fail circuit 208 during each shift cycle 408. If desired the CTL-(1-$n$) inputs 1306 from the tester can be registered by the SCK prior to being input to the expected data formatter 306, as seen in dotted line area 1706. As can be seen, the operation of the expected data formatter 306 is similar to the operation of the stimulus data formatter 306 of FIG. 4.

FIGS. 18A-18D illustrate, according to the disclosure, the operation of each section 502-508 of expected data formatter circuit 306 in producing expected data bit streams (EBS1-$n$) from response bit streams (RBS1-$n$) in response to CTL1-$n$ inputs 1306 from the tester. The structure and operation of the expected data formatter 306 sections 502-508 of FIGS. 18$a$-18D are the same as the stimulus data formatter 306 sections 502-508 of FIGS. 5$a$-5D. The only difference between FIGS. 5A-5D and FIGS. 18A-18D is that an expected data bit stream may not be produced using a response data bit stream that is to be compared against the produced expected data bit stream. For example, formatter section 502 of FIG. 18A cannot use the RBST output from circuit 301 to produce the EBS1 input to compare pass/fail circuit 208. Similarly, formatter section 504 cannot use the RBS2 output of circuit 301 to produce the EBS2 input to compare pass/fail circuit 208, and so on. The reason for this is obvious since if a failing response output signal were used to provide an expected data signal to compare against the failing response output signal, no failure would be detected since the failing response output signal would be compared against itself.

Figure 19:
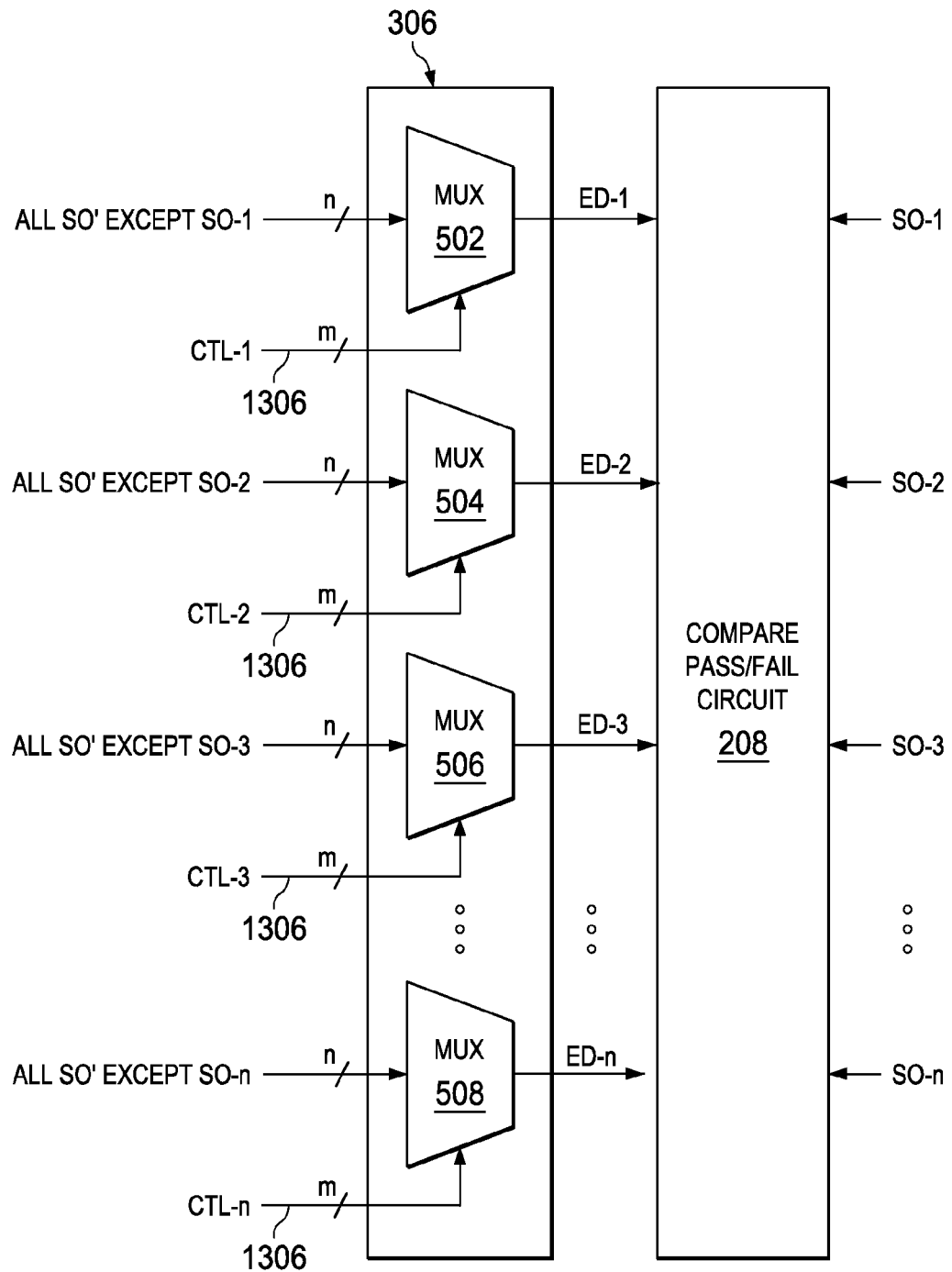
FIG. 19 illustrates an expected data formatter with independently controlled multiplexer sections according to the disclosure.

FIG. 19 illustrates an expected data formatter circuit 306 providing formatted expected data (ED1-$n$) to the compare pass/fail memory 208 using separate control buses (CTL1-$n$) 1306. The structure and operation of the expected data formatter circuit 306 of FIG. 19 is the same as the stimulus data formatter circuit 306 of FIG. 7 with the exception that the expected data formatter circuit provides expected data inputs (ED1-$n$) to the compare pass/fail circuit 208 instead of stimulus data to the scan paths 104 of circuit 301. The separate control inputs (CTL1-$n$) 1306 to each formatter section 502-508 may be provided directly by the tester as described in FIG. 7, provided using a circuit 802 as described in FIG. 8, or provided using a 902 as described in FIG. 9.

Figure 20:
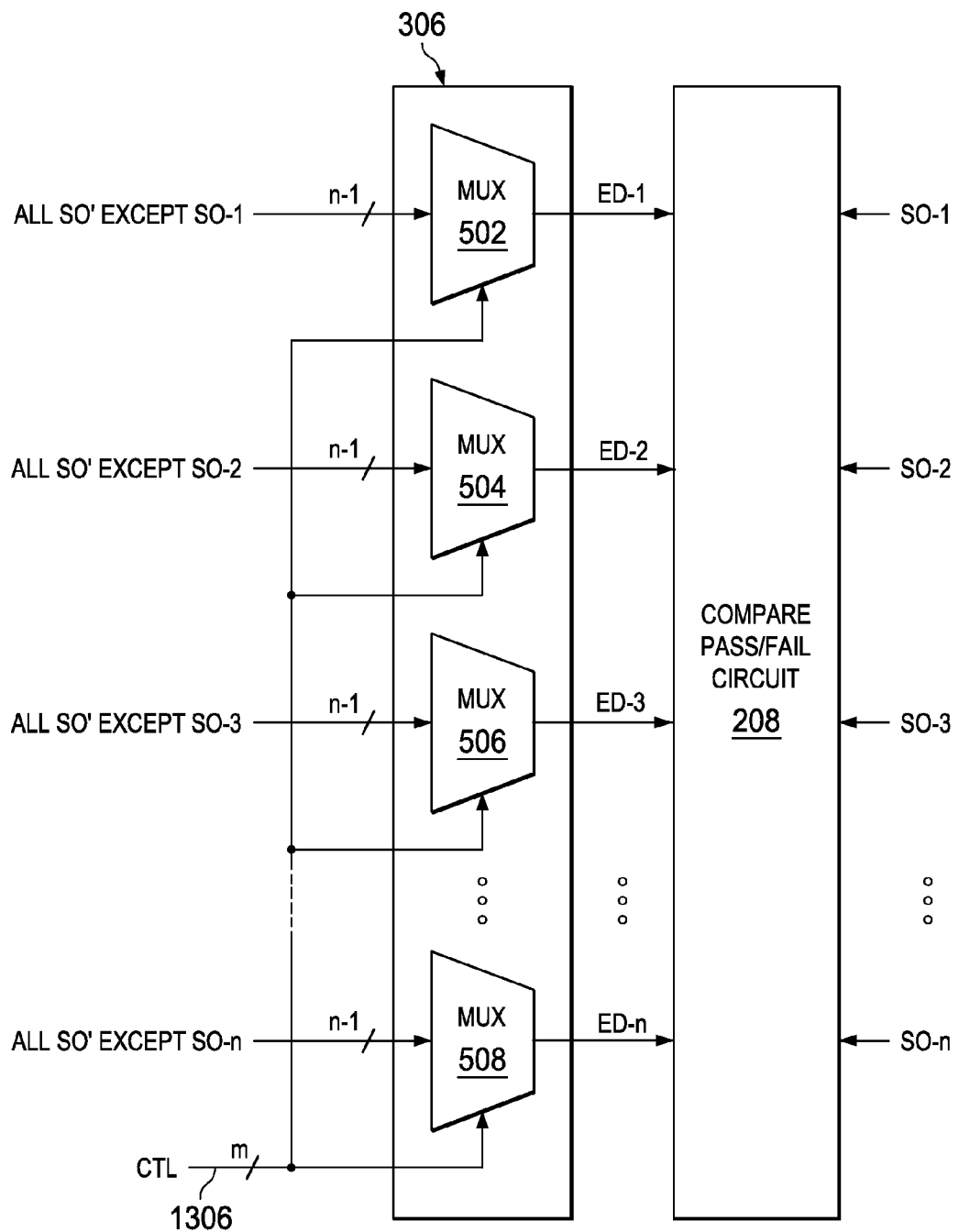
FIG. 20 illustrates an expected data formatter with commonly controlled multiplexer sections according to the disclosure.

FIG. 20 illustrates an expected data formatter circuit 306 providing formatted expected data (ED1-$n$) to the compare pass/fail memory 208 using a common control bus (CTL) 1306. The structure and operation of the expected data formatter circuit 306 of FIG. 20 is the same as the stimulus data formatter circuit 306 of FIG. 10 with the exception that the expected data formatter circuit provides expected data inputs (ED1-$n$) to the compare pass/fail circuit 208 instead of stimulus data to the scan paths 104 of circuit 301. The common control bus (CTL) 1306 to each formatter section 502-508 is provided directly by the tester as described in FIG. 10.

As will be described in FIG. 21, this disclosure describes a process for analyzing the response output pattern set 1104 of circuit 301 to produce an expected data input pattern set 1704 for input to a compare pass/fail circuit 208, via a formatter circuit 306 that uses the common control bus (CTL) 1306 approach described in regard to FIG. 20 above. The process involves the steps of analyzing each response bit stream 1112 of each response output 1108 to find response bit stream segments that can be formatted, via a formatter 306, and used as expected data inputs 1704 to the compare pass/fail circuit 208.

Figure 21A:
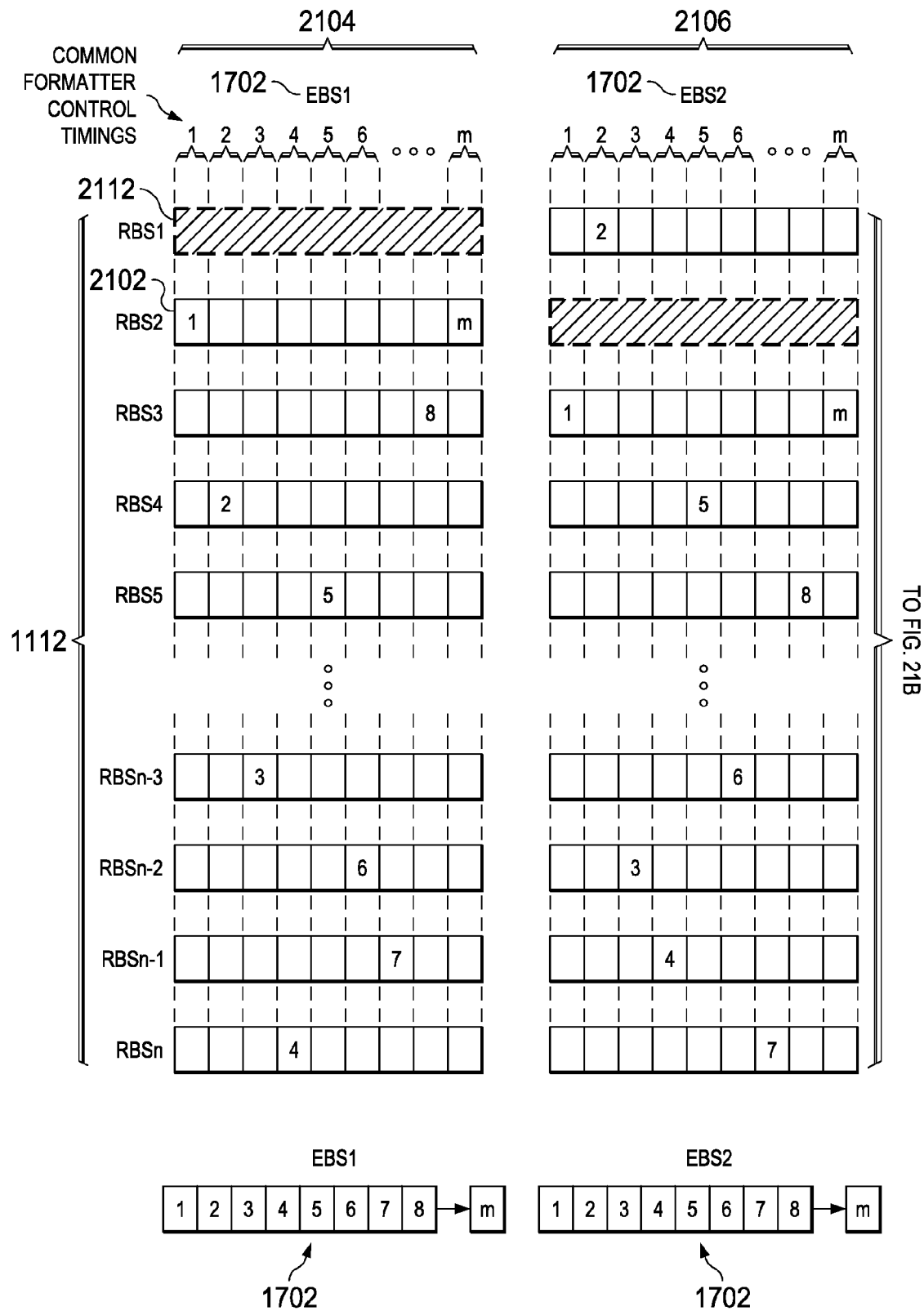
FIGS. 21A and 21B illustrate the process of producing expected data from response outputs using common control bus timings according to the disclosure.
Figure 21B:
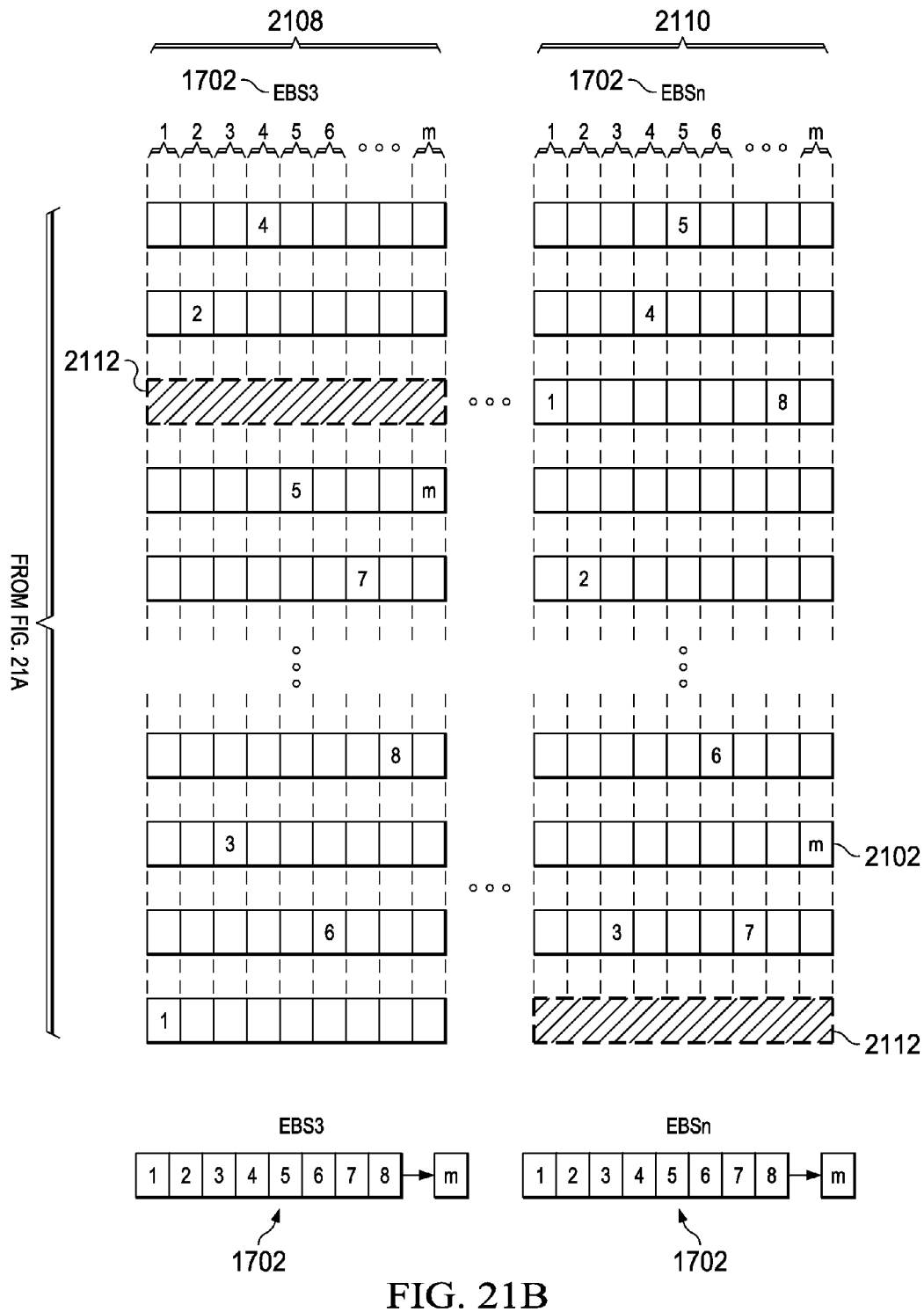

FIG. 21 illustrates the process of analyzing the response bit streams 1-$n$ (RBS1-$n$) 1112 of a response output 1108 of a circuit 301 during a shift cycle to provide expected data bit streams 1-$n$ (EBS1-$n$) 1702 that can be used to provide expected data input to a compare pass/fail circuit 208 during a shift cycle. As seen, common formatter control timings 1-$m$ from the control bus (CTL) 1306 of FIG. 20 are established that partition the RBS1-$n$ into segments 2102. During each control timing 1-$m$, the segments 2102 of each RBS1-$n$ output are analyzed to find response bit segments 2102 that can be used as EBS1-$n$ inputs 1702 to compare pass/fail circuit 208. For example, the EBS1 input to compare pass/fail circuit 204 is shown in column 2104 being formed by using bit segment 1 2102 from RBS2, bit segment 2 2102 from RBS4, bit segment 3 2102 from RBSn-3, bit segment 4 2102 from RBSn, bit segment 5 2102 from RBS5, bit segment 6 2102 from RBSn-2, bit segment 7 2102 from RBSn-1, bit segment 8 2102 from RBS3, and on to bit segment "m" 2102 from RBS2. Similarly the SBS2-$n$ inputs to compare pass/fail circuit 208 are shown in columns 2106-2110 being similarly formed by using bit segments 2102 of the RBS1-$n$ outputs. As previously mentioned in regard to FIGS. 18A-18D and as indicated in shaded areas 2112 of FIG. 21, certain RBS1-$n$ inputs to formatter 306 cannot be used to produce EBS1-$n$ outputs from formatter 306.

Any number of control timings 1-$m$ can be used. Also each of the control timings 1-$m$ can provide bit segments 2102 that contain one or more response bits. Further, the response bit segments 2102 may be selected from all the RBS1-$n$ outputs, except as mentioned above in regard to FIGS. 18A-18D, or from only a subset of the RBS1-$n$ outputs. The process described above is repeated on the RBS1-$n$ 1112 of each response output 1108 of circuit 301 to produce the desired EBS1-$n$ 1702 inputs for each expected data input 1704 to compare pass/fail circuit 208.

Figure 22:
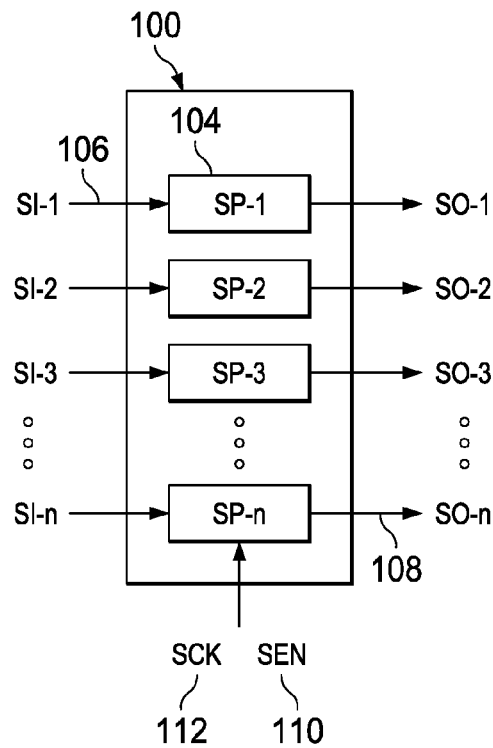
FIG. 22 illustrates a circuits scan test architecture.

FIG. 22 illustrates a circuit 100 to be tested using "$n$" parallel scan paths (SP1-$n$) 104. A tester testing circuit 100 would need to interface with the circuit using "$n$" scan inputs (SI1-$n$) 106 and "$n$" scan outputs (SO1-$n$) 108, as well as the SEN 110 and SCK 112 signals. If the circuit 100 had 128 scan paths, a tester would need interfacing for 128 scan inputs, 128 scan outputs, and the SEN and SCK inputs (i.e. 258 signals). Using a large number of shorter length scan paths to test circuit 100 is beneficial since it takes less time to perform shift cycle operations, which reduces test time. However as seen the number of interfaces to a tester increases as the number of scan paths increases.

Figure 23:
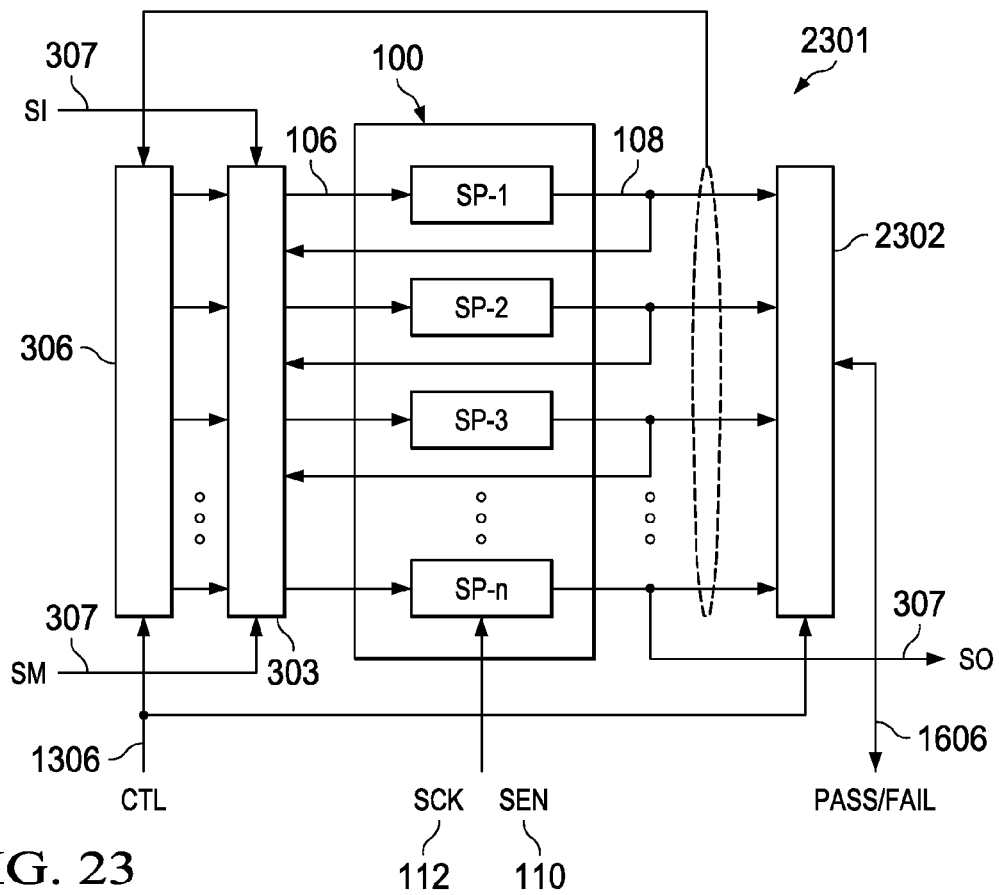
FIG. 23 illustrates wrapping the scan inputs and scan outputs of the FIG. 22 circuit with formatter and compare pass/fail circuits according to the disclosure.

FIG. 23 illustrates an arrangement 2301 whereby the circuit 100 of FIG. 22 is interfaced to the stimulus data formatter 306 of FIG. 16 to drive its scan inputs 106 and a circuit 2302, comprising the expected data formatter 306 and compare pass/fail circuit 208 of FIG. 16, to receive its scan outputs 108. As described in FIG. 3A, multiplexers 303 are also provided at the scan inputs 106 of circuit 100 to provide for initializing the scan paths 104 of circuit 100 via the serial interface 307. As seen, the interface to a tester would include the serial interface 307, control bus (CTL) 306, the pass/fail output bus 1606 and the SEN 110 and SCK 112 control signals. If the circuit 100 had 128 scan paths 104, as mentioned in FIG. 22, and used a common control bus (CTL) as shown in FIGS. 10, 16 and 20, the tester would only need interfacing to provide the 3 serial interface signals 307 to initialize the scan paths 104, 7 or less common control bus (CTL) signals 1306 to operate the stimulus and expected data formatters 306, the pass/fail bus signals 1606, which could be a single signal, and the SEN 110 and SCK 112 input signals. It should be understood that circuit 2302 could also be the MISR circuit 1506 of FIG. 15 and the pass/fail bus could be the serial bus 1508 of FIG. 15 that unloads the test signature at the end of test.

In comparing the tester interface signal requirements of FIGS. 22 and 23, it is clear that the disclosure provides an approach that significantly decreases the number of interface signals between a tester and a circuit to be tested that uses a large number of scan paths, which decreases the tester cost. Also, smaller interfaces between a circuit to be tested and a tester enables more circuits to be tested in parallel.

Figure 24:
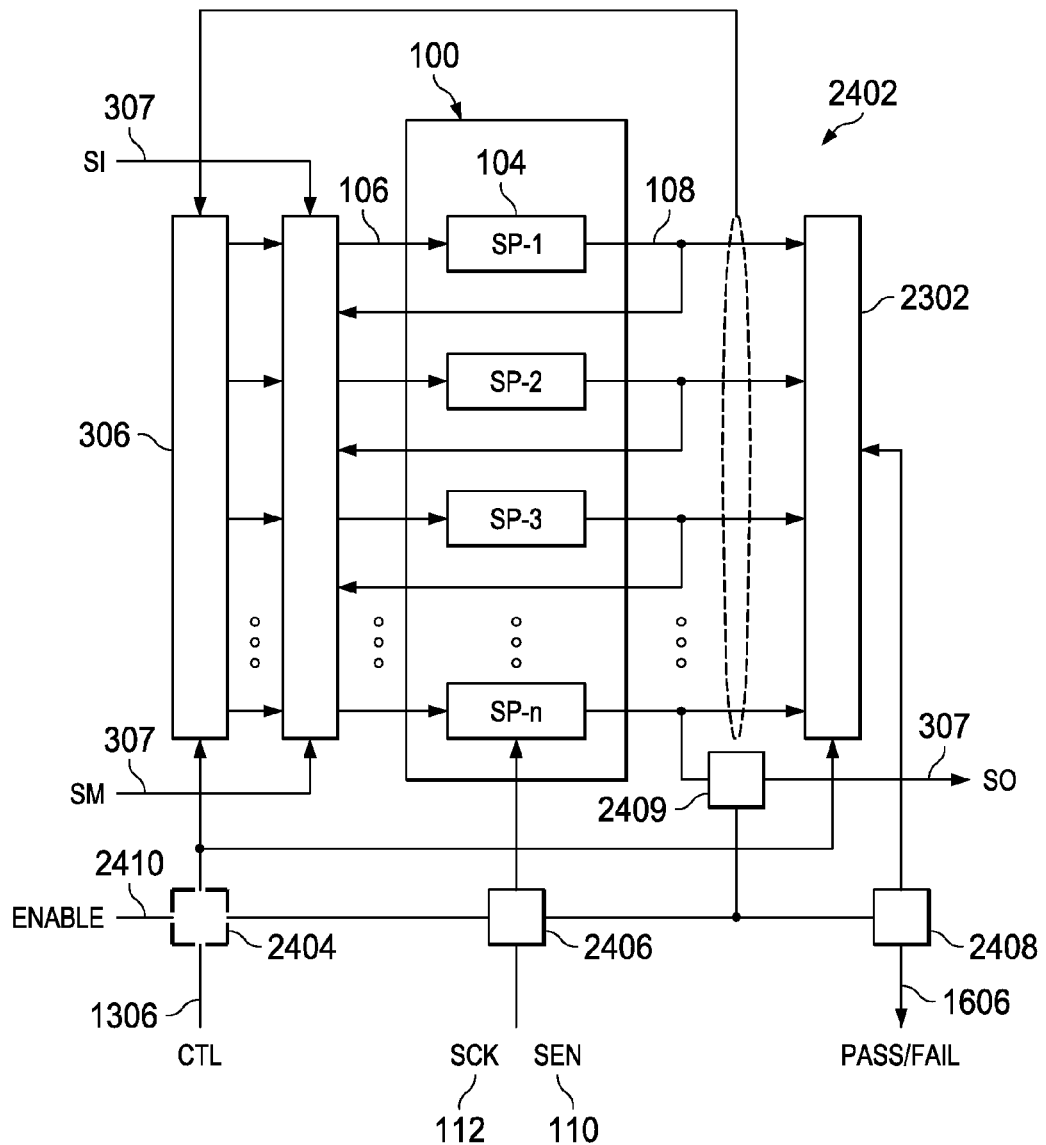
FIG. 24 illustrate placing enable circuitry on the test interface signals of the FIG. 23 circuit arrangement according to the disclosure.

FIG. 24 illustrates an arrangement 2401 whereby the circuit arrangement 2301 of FIG. 23 is augmented with gating circuits 2404-2409 on the CTL 1306, SCK 112, SEN 110, pass/fail bus 1606, and SO 307 signals, and an enable signal 2410 to control the gating circuits. In response to the enable signal 2410 the CTL, SCK and SEN inputs to the circuit 2402 and the pass/fail bus and SO outputs from the circuit 2402 can be enabled or disabled. The gating circuit 2404 on the CTL signals 1306 is optional, as indicated in dotted line, and is shown merely as a way to eliminate the switching operation of the formatter 306 when the enable signal 2410 is in the disable state. Disabling the CTL signals 1306 to formatter 306 reduces test power consumption and noise when another circuit 2402 is enabled for testing using the CTL signals 1306. The advantage of the enable and gating circuits are described in FIG. 25.

Figure 25:
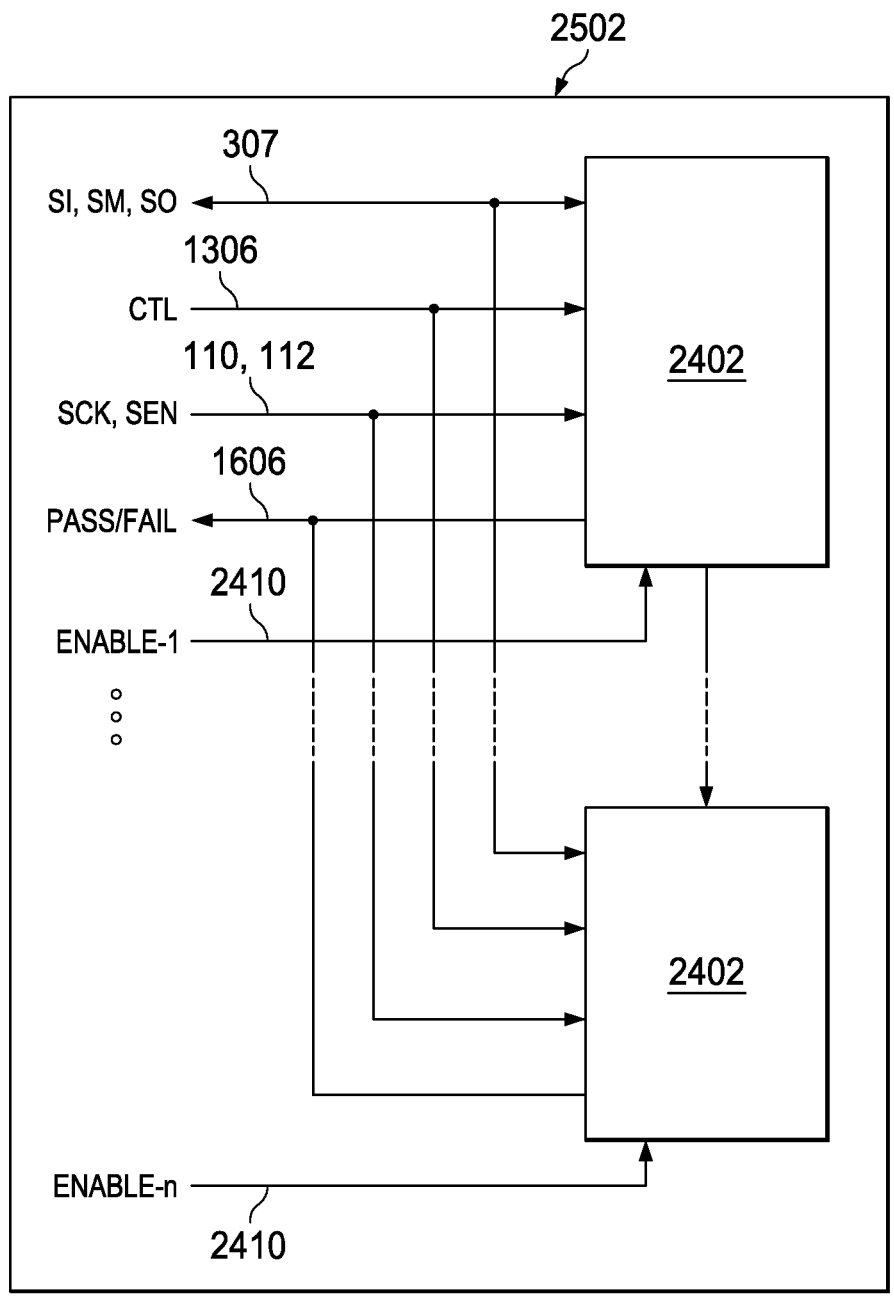
FIG. 25 illustrates a device with multiple FIG. 24 circuits to be tested using a common test interface according to the disclosure.

FIG. 25 illustrates an IC 2502 that includes a number of circuit arrangements 2402, each circuit arrangement 2402 having a unique enable signal 2410. When one of the circuit arrangements 2402 is to be tested, its enable signal is set to allow the CTL, SEN, SCK, pass/fail and SO signals to pass through the gating circuits 2404-2409. Likewise other circuit arrangements 2402 are tested by enabling their CTL, SEN, SCK, pass/fail and SO signals. The advantage with separately enable-able circuits 2402 is that they can all be interfaced to a common CTL, SEN, SCK, pass/fail, and SO signal interface to a tester.

Figure 26:
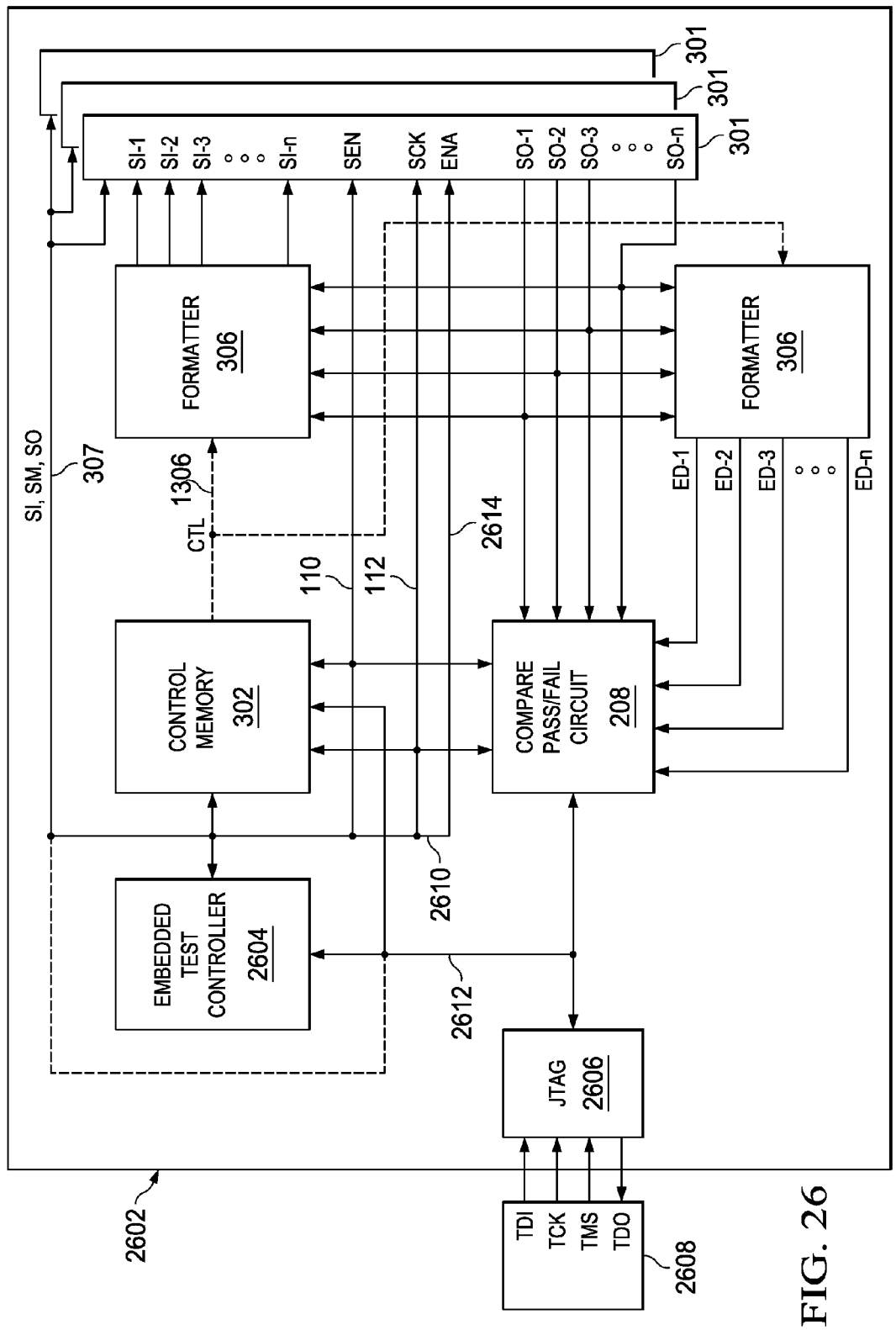
FIG. 26 illustrates a device self-test architecture using stimulus and response formatter circuits and a JTAG interface.

FIG. 26 illustrates an IC 2602 that comprises a JTAG port 2606, an embedded test controller 2604, a control memory 302, stimulus and expected data formatters 306, compare pass/fail circuit 208, and plural circuits 301 to be tested. The JTAG port is a well known IC test interface defined by IEEE standard 1149.1 that is used to control test circuitry within the IC. The JTAG port 2606 is connected externally to a tester 2608, via TDI, TCK, TMS and TDO signals, and internally to the embedded test controller 2604, compare pass/fail circuit 208 and the control memory 302 via bus 2612. The embedded test controller 2604 is similar to test controller 210 used in tester 300 with the exception that it is optimized for use within the IC to control the control memory 302, the compare pass/fail circuit 208 and the circuit 301 being tested via control bus 2610.

As seen, the embedded test controller outputs control via bus 2610 to; (1) operate the control memory to output control (CTL) 1306 to the stimulus and expected data formatters 306, (2) operate the compare pass/fail circuit 208, via the SEN and SCK signals, to compare the response outputs to expected data inputs, (3) to operate the SEN and SCK signals to control the selected circuit 301 being tested, (4) to operate enable (ENA) signals 22614 to circuits 301 to allow the SEN and SCK signals to be input to the selected circuit 301 being tested and the serial outputs (SO-1-n) to be output from the circuit 302 being tested, and (5) to operate the serial interface 307 to initialize the scan paths 104 of the circuit 301 being tested. When the enable (ENA) signal to a circuit 301 is active, the SEN and SCK inputs are enabled to control the circuit's scan paths 104 and the circuit's scan path outputs are enabled to output response data. When the enable (ENA) signal to a circuit 301 is inactive, the SEN and SCK inputs are disabled from controlling the circuit's scan paths 104 and the circuit's scan path outputs are disable from outputting response data.

Prior to testing, the tester 2608 operates the JTAG port 2606 to upload formatter control (CTL) into the control memory 302, via bus 2612, for testing a particular one of the circuits 301. After the control memory is loaded, the tester inputs a command, via bus 2612, to the embedded test controller 2604 to identify which circuit 301 is to be tested. In response to the command input, the embedded test controller 2604 executes an embedded program that initializes the scan paths 104 of the selected circuit 301 via serial interface 307, then tests the selected circuit 301 by outputting control (CTL) on bus 2610 to the control memory 302, outputting SEN and SCK control to the compare pass/fail circuit 208, and outputting SEN and SCK control to the circuit 301 being tested.

The tester 2608 monitors the status of the test by polling the embedded test controller 2604 via bus 2612 of the JTAG port 2606. When the tester 2608 determines, via the polling, that the test is complete, it operates the JTAG port 2606 to access the information stored in the compare pass/fail circuit 208 using bus 2612 to determine whether the enabled circuit 301 has passed or failed the test. Similarly, the other circuits 301 of IC 2602 are enabled and tested using the stimulus and response formatter based test arrangement of FIG. 26.

Figure 27:
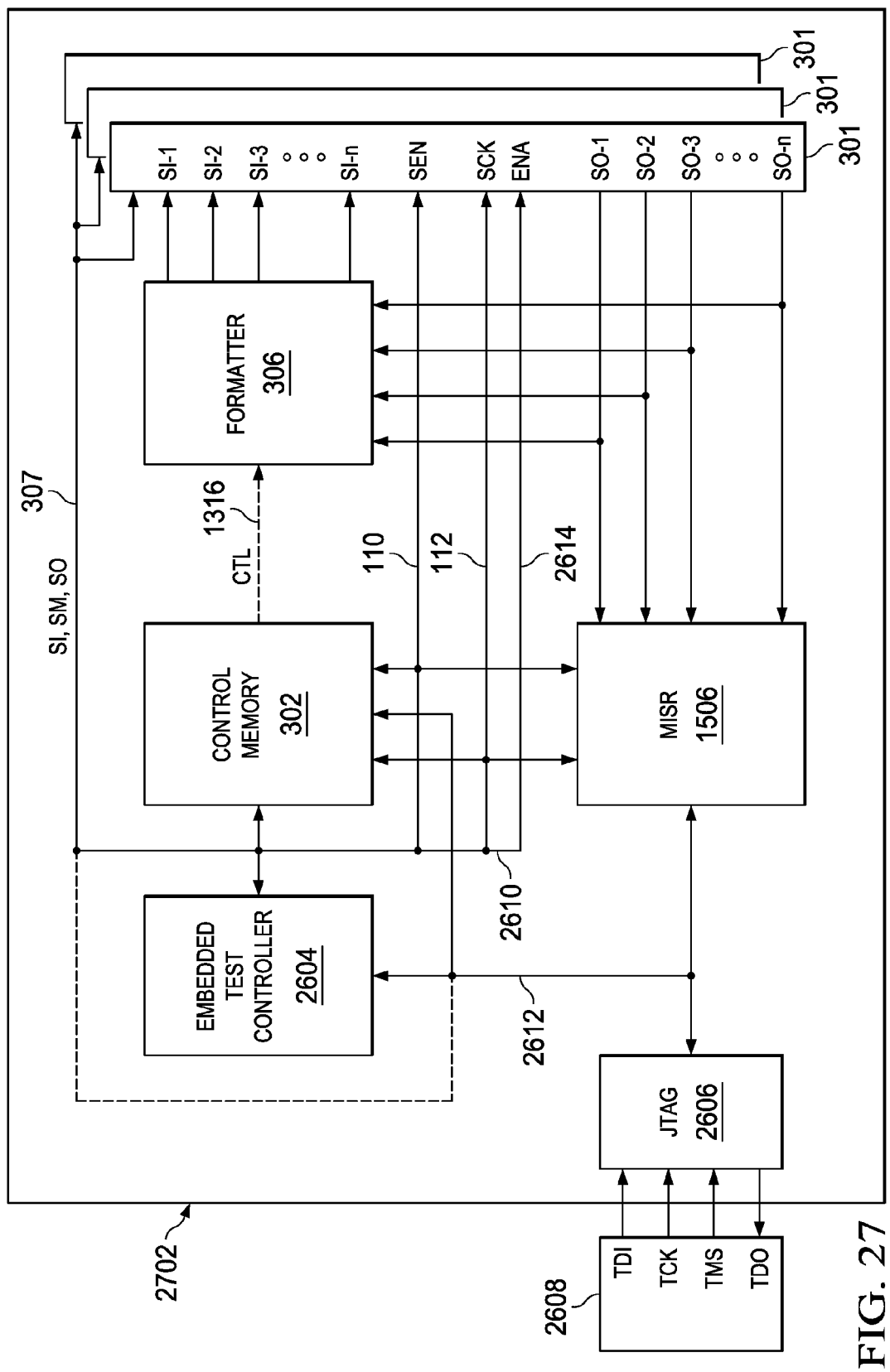
FIG. 27 illustrates a device self-test architecture using a stimulus formatter circuit, a MISR circuit and a JTAG interface.

FIG. 27 illustrates an IC 2702 that comprises the JTAG port 2606 of FIG. 26, the embedded test controller 2604 of FIG. 26, the control memory 302 of FIG. 26, stimulus data formatter 306 of FIG. 26, the MISR 1506 of FIG. 15, and plural circuits 301 to be tested. IC 2702 is identical in structure and operation to the IC 2602 of FIG. 26 with the exception that the MISR 1506 is used instead of compare pass/fail circuit 208 and expected data formatter 306. During test, the embedded controller operates the MISR, via the SEN 110 and SCK 112 signals, to compress the serial outputs (SO-1-n) of the selected circuit 301 into a signature.

Prior to testing, the tester 2608 operates the JTAG port 2606 to upload formatter control (CTL) into the control memory 302, via bus 2612, for testing a particular one of the circuits 301. After the control memory is loaded, the tester inputs a command, via bus 2612, to the embedded test controller 2604 to identify which circuit 301 is to be tested. In response to the command input, the embedded test controller 2604 executes an embedded program that initializes the scan paths 104 of the selected circuit 301 via serial interface 307, then tests the selected circuit 301 by outputting control (CTL) on bus 2610 to the control memory 302, outputting SEN and SCK control to the MISR 1506, and outputting SEN and SCK control to the circuit 301 being tested.

The tester 2608 monitors the status of the test by polling the embedded test controller via bus 2612 of the JTAG port 2606. When the tester 2608 determines, via the polling, that the test is complete, it operates the JTAG port 2606 to access the signature stored in the MISR 1506 using bus 2612 to determine whether the enabled circuit 100 has passed or failed the test. Similarly, the other circuits 100 of IC 2602 are enabled and tested using the formatter and MISR based test arrangement of FIG. 26.

It should be understood that the control memory 302 of FIGS. 26 and 27 may be a non-volatile memory (ROM, EPROM) that contains all the formatter control (CTL) 306 patterns required for testing each circuit 301. In that case, the uploading step mentioned above in regard to FIGS. 26 and 27 would not be necessary and the testing could commence by simply inputting a command to the embedded test controller 2604 via bus 2612 of JTAG port 2606 to execute a program that initializes the scan paths of the selected circuit 301 then tests the selected circuit 301.

As seen in dotted line, the JTAG port may be used to initialize the scan paths of a circuit 301, via bus 2612, instead of using the embedded controller's bus 2610 to initialize the scan paths of a circuit 301. In this case, the testing could commence by simply inputting a command to the embedded test controller 2604 via bus 2612 of JTAG port 2606 to immediately start the execution of a program that tests the selected circuit 301.

As can be seen, the advantages of the embedded test architectures of FIGS. 26 and 27 is that testing of circuits 301 within an IC can be effectively enabled and executed, according to the disclosure, using only a JTAG port on the IC. Since the testing only requires the JTAG port, the testing can be used in a myriad of environments, including IC manufacture, IC burn-in, IC customer integration and test, and field service testing.

Although the disclosure has been described in detail, it should be understood that various changes, substitutions and alterations may be made without departing from the spirit and scope of the disclosure as defined by the appended claims.

What is claimed is:
1. An integrated circuit comprising:
 A. functional circuitry;
 B. parallel scan paths connected to the functional circuitry, each parallel scan path having a stimulus data input, a response data output, and scan control inputs;
 C. formatter control input leads; and

D. formatter circuitry having one data output connected to the stimulus data input of each parallel scan path, a data input connected to the response data output of each parallel scan path, and control inputs connected to the formatter control input leads, the formatter circuitry selectively routing response data from any one of the response data outputs to any one of the stimulus data inputs.

2. The integrated circuit of claim 1 in which the scan control inputs include a clock input and an enable input.

3. The integrated circuit of claim 1 in which the formatter control leads are accessible externally of the integrated circuit.

4. The integrated circuit of claim 1 in which the response data outputs are accessible externally of the integrated circuit.

* * * * *